(12) United States Patent
Ikegami et al.

(10) Patent No.: US 11,481,191 B2
(45) Date of Patent: Oct. 25, 2022

(54) ARITHMETIC DEVICE HAVING MAGNETORESISTIVE EFFECT ELEMENTS

(71) Applicant: KABUSHIKI KAISHA TOSHIBA, Tokyo (JP)

(72) Inventors: Kazutaka Ikegami, Tokyo (JP); Shinobu Fujita, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 426 days.

(21) Appl. No.: 16/724,800

(22) Filed: Dec. 23, 2019

(65) Prior Publication Data
US 2020/0241840 A1 Jul. 30, 2020

(30) Foreign Application Priority Data
Jan. 30, 2019 (JP) .............................. JP2019-014355

(51) Int. Cl.
*G11C 11/16* (2006.01)
*G06F 7/38* (2006.01)
*H01L 27/22* (2006.01)

(52) U.S. Cl.
CPC ............ *G06F 7/383* (2013.01); *G11C 11/161* (2013.01); *G11C 11/1657* (2013.01);
(Continued)

(58) Field of Classification Search
CPC ... G11C 11/16; G11C 11/161; G11C 11/1657; G11C 11/1659
(Continued)

(56) References Cited

U.S. PATENT DOCUMENTS

2007/0297223 A1* 12/2007 Chen ....................... G11C 11/16
365/173
2016/0247567 A1 8/2016 Ikegami et al.
(Continued)

FOREIGN PATENT DOCUMENTS

JP 2014-22681 A 2/2014
JP 6364365 B2 7/2018
(Continued)

OTHER PUBLICATIONS

Inokuchi et al., "Improved read disturb and write error rates in voltage-control spintronics memory (VoCSM) by controlling energy barner height," Applied Physics Letters, 110:252401-1-252401-4 (Jun. 20, 2017).
(Continued)

*Primary Examiner* — Alfredo Bermudez Lozada
(74) *Attorney, Agent, or Firm* — Finnegan, Henderson, Farabow, Garrett & Dunner L.L.P.

(57) ABSTRACT

According to one embodiment, an arithmetic device includes a first computational circuit including a first string, the first string having a first magnetoresistive effect element on a first conducting layer; a second computational circuit including a second strings, the second string having second magnetoresistive effect element on a second conducting layer; a third computational circuit executing computational processing using a first signal from the first computational circuit and a second signal from the second computational circuit; and a control circuit. The control circuit sets a condition on write operations with respect to at least one of the first and second magnetoresistive effect elements, based on information related to write error in at least one of the first and second magnetoresistive effect elements.

9 Claims, 29 Drawing Sheets

(52) U.S. Cl.
CPC ...... *G11C 11/1659* (2013.01); *G11C 11/1675* (2013.01); *G11C 11/1655* (2013.01); *G11C 11/1673* (2013.01); *H01L 27/228* (2013.01)

(58) Field of Classification Search
USPC ........................................................ 365/158
See application file for complete search history.

(56) References Cited

U.S. PATENT DOCUMENTS

| | | |
|---|---|---|
| 2019/0088302 A1 | 3/2019 | Shimomura et al. |
| 2019/0295619 A1 | 9/2019 | Inokuchi et al. |

FOREIGN PATENT DOCUMENTS

| | | |
|---|---|---|
| JP | 6416421 B1 | 10/2018 |
| JP | 2019-164870 A | 9/2019 |
| JP | 2019-216208 A | 12/2019 |
| WO | WO 2010/087271 A1 | 8/2010 |

OTHER PUBLICATIONS

Shih et al., "Logic Process Compatible 40nm 16Mb, Embedded Perpendicular-MRAM with Hybrid-Resistance Reference, sub-µA Sensing Resolution, and 17.5nS Read Access Time," 2018 Symposium on VLSI Circuits Digest of Technical Papers, pp. 79-80 (2018).

* cited by examiner

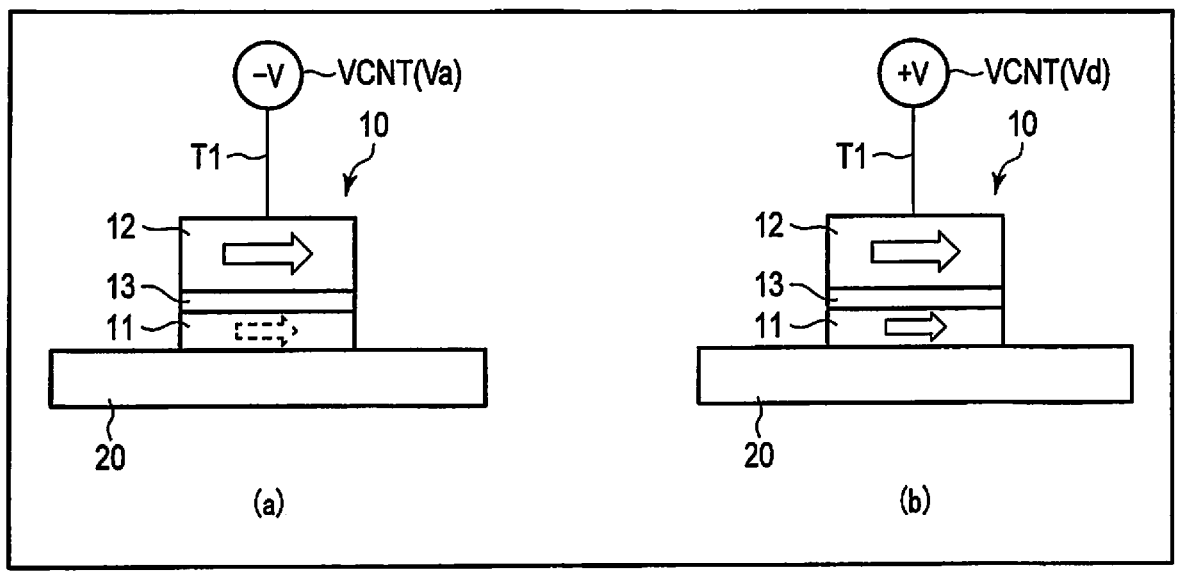
F I G. 4

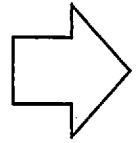
FIG. 6
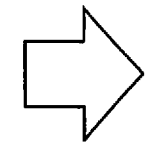
FIG. 7
| A | B | OR(Q1) | AND(Q2) | XNOR |
|---|---|---|---|---|
| 0 | 0 | 0 | 0 | 1 |
| 0 | 1 | 1 | 0 | 0 |
| 1 | 0 | 1 | 0 | 0 |
| 1 | 1 | 1 | 1 | 1 |
FIG. 8

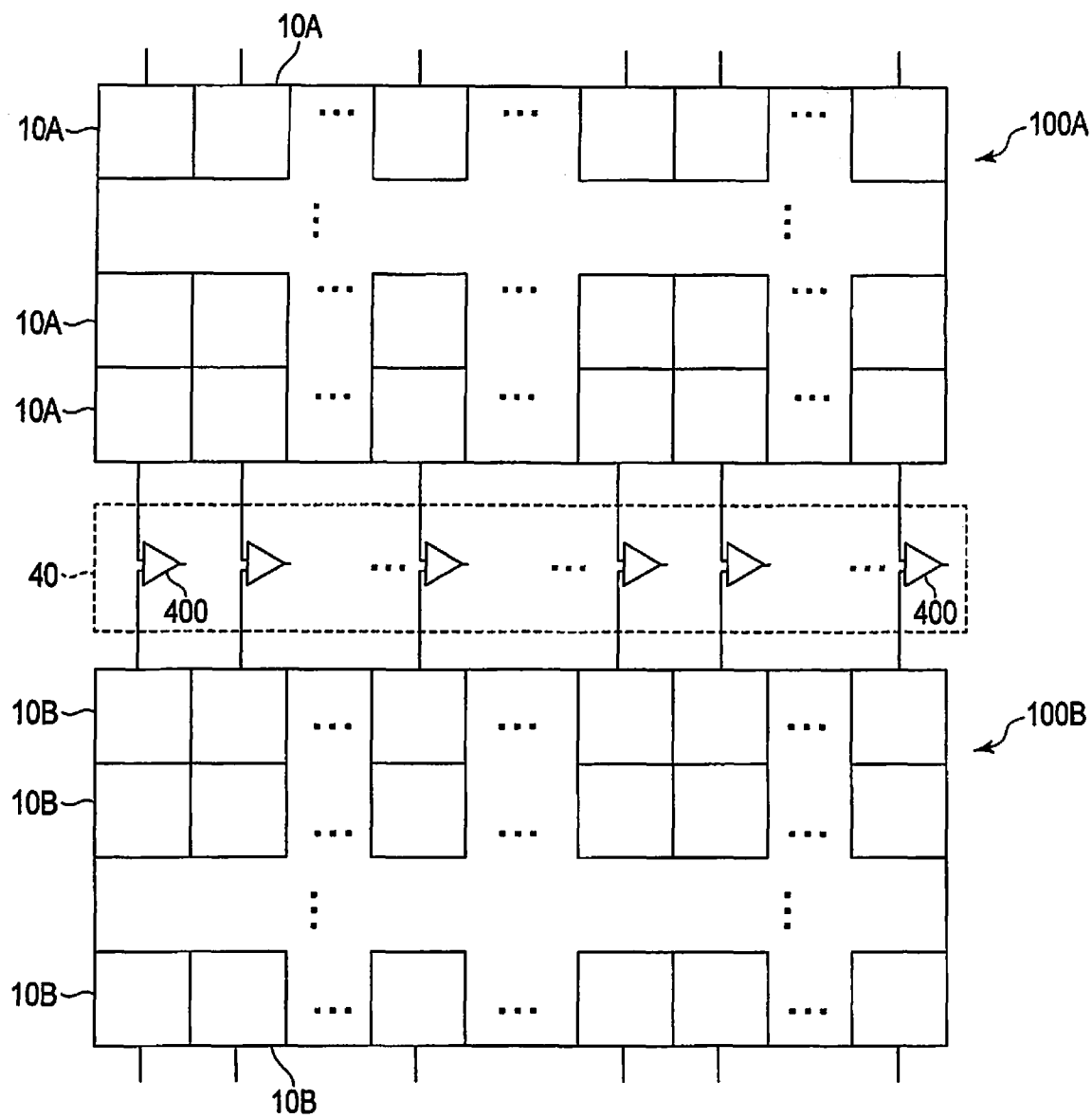
F I G. 16

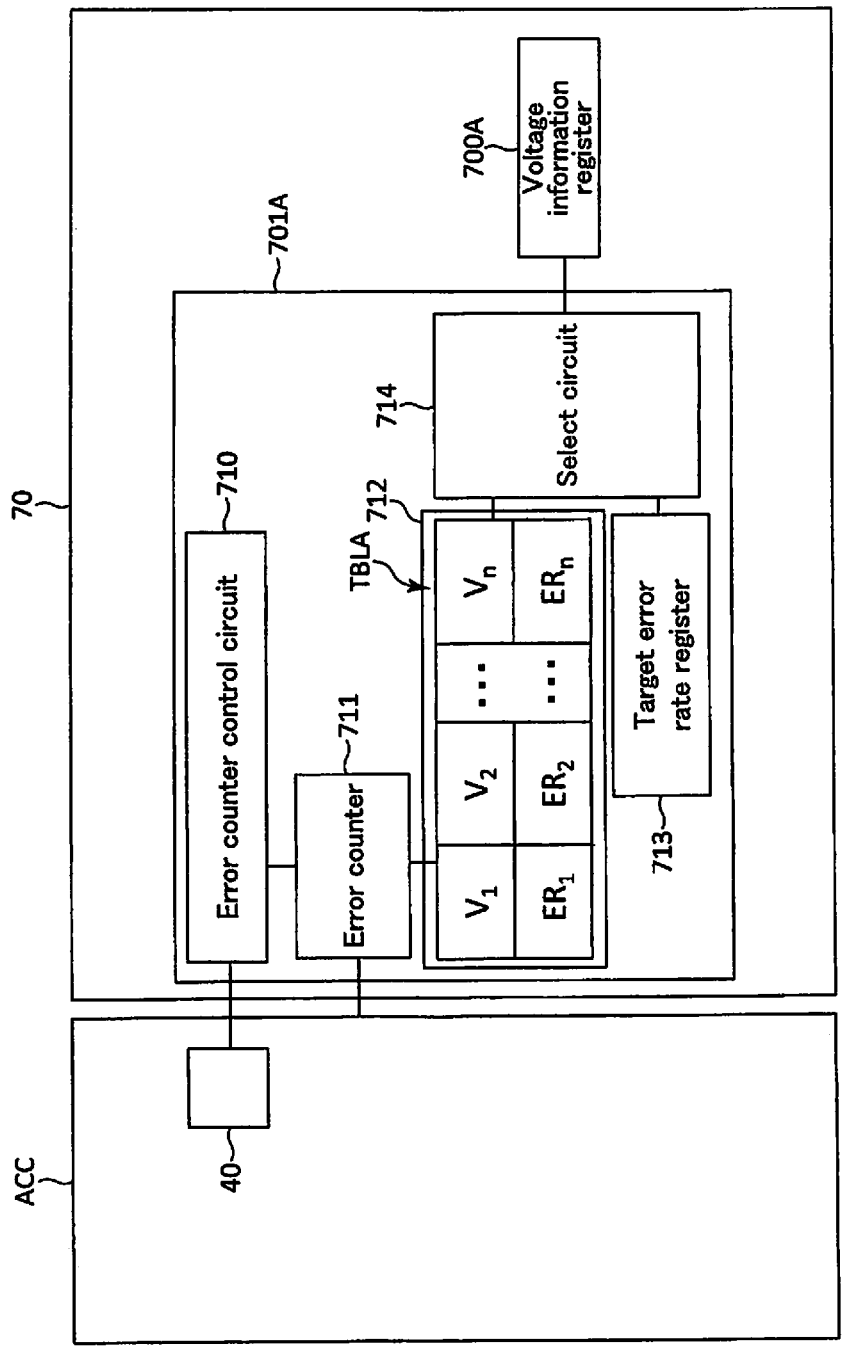
F I G. 25

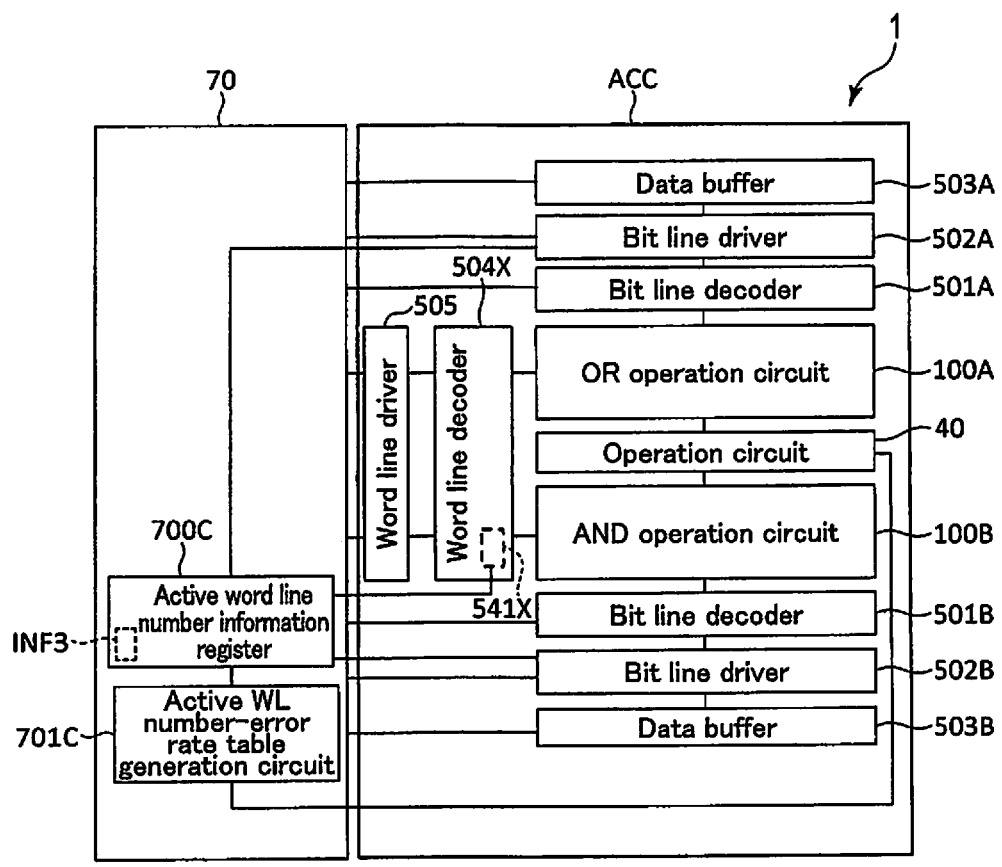
F I G. 34

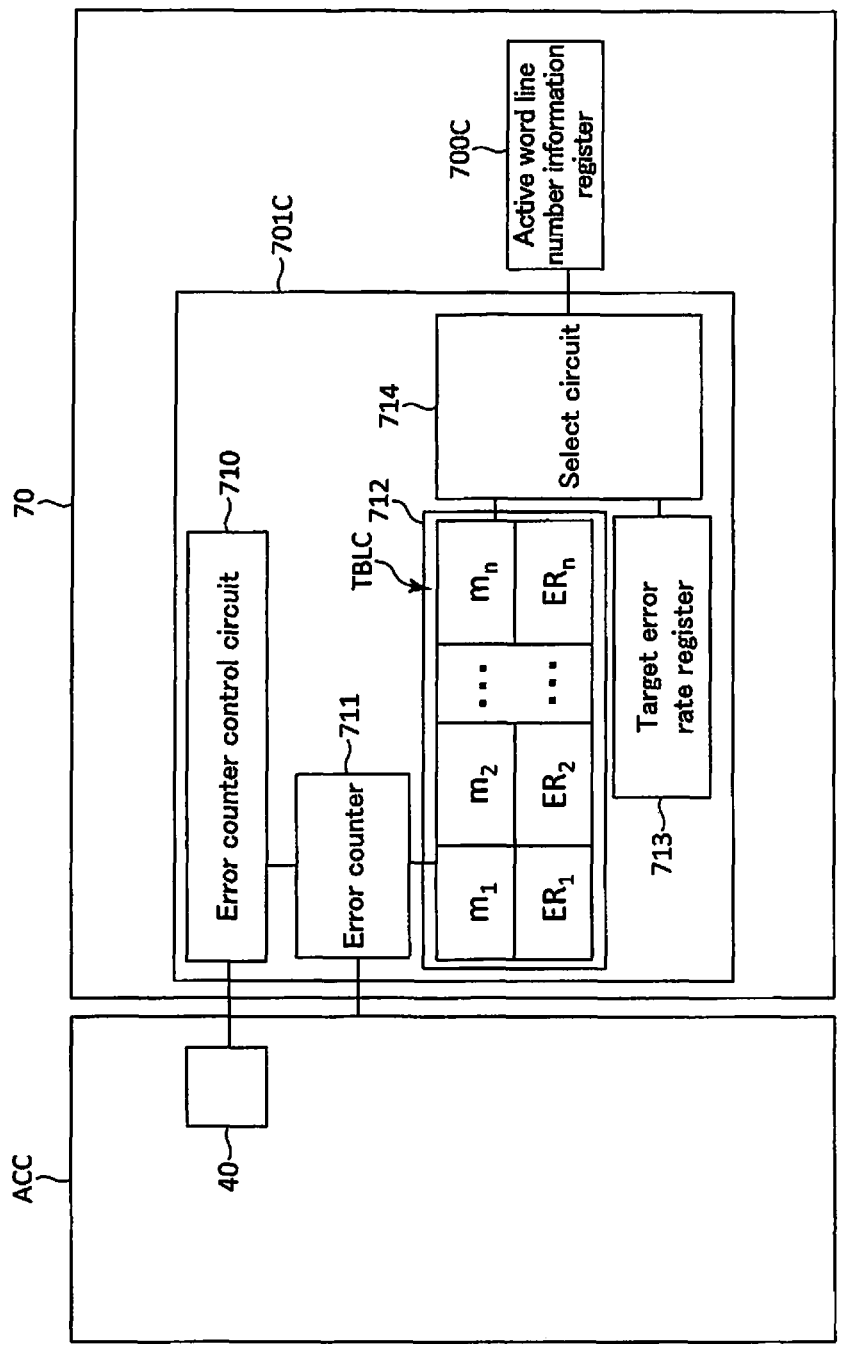
F I G. 35

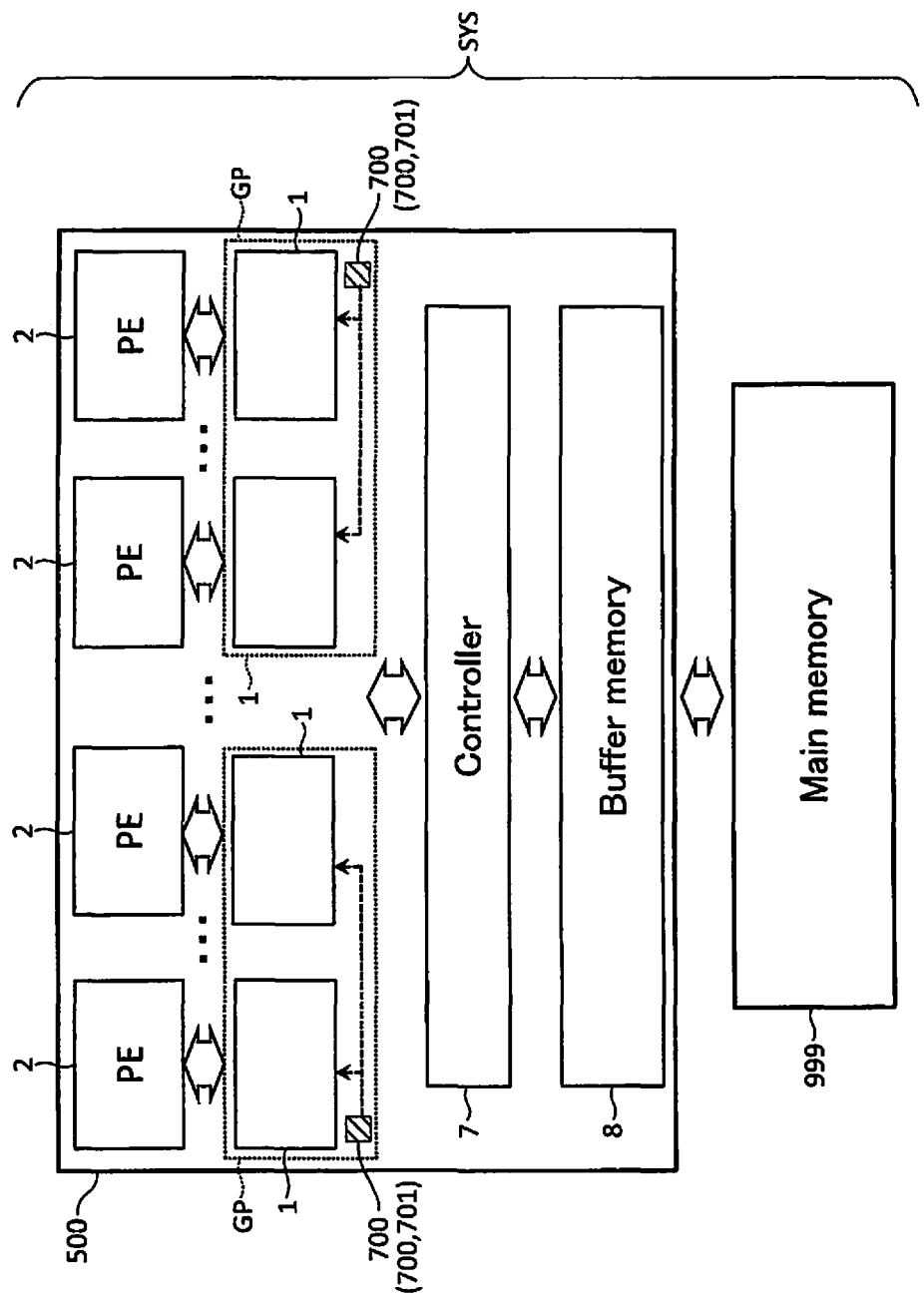
F I G. 38

ARITHMETIC DEVICE HAVING MAGNETORESISTIVE EFFECT ELEMENTS

CROSS-REFERENCE TO RELATED APPLICATIONS

This application is based upon and claims the benefit of priority from Japanese Patent Application No. 2019-014355, filed Jan. 30, 2019, the entire contents of which are incorporated herein by reference.

FIELD

Embodiments described herein relate generally to an arithmetic device.

BACKGROUND

Arithmetic devices are used in computational processing such as AI deep learning. Research and development for improving the performance of arithmetic devices are advancing.

BRIEF DESCRIPTION OF THE DRAWINGS

FIGS. 2, 3, 4, 5, 6, 7, and 8 are diagrams for explaining operating principles of the arithmetic device according to the first embodiment.

FIGS. 16, 17, 18, 19, 20, and 21 are diagrams illustrating exemplary operations of the arithmetic device according to the first embodiment.

FIGS. 24 and 25 are diagrams illustrating an exemplary configuration of an arithmetic device according to a second embodiment.

FIGS. 34 and 35 are diagrams illustrating an exemplary configuration of an arithmetic device according to a sixth embodiment.

FIGS. 36, 37, and 38 are diagrams illustrating exemplary applications of an arithmetic device according to an embodiment.

DETAILED DESCRIPTION

FIGS. 1 to 38 will be referenced to describe an arithmetic device according to the embodiments.

Hereinafter, embodiments will be described in detail and with reference to the drawings. In the following description, elements having the same function and configuration are denoted with the same signs.

Also, in each of the following embodiments, components denoted by a reference sign accompanied by a distinguishing numeral or letter at the end (such as "word line WL", "bit line BL", and various voltages and signals, for example) will be collectively referred to using a notation (reference sign) omitting the trailing numeral/letter in cases where the components do not have to be individually distinguished from each other.

In general, according to one embodiment, an arithmetic includes: a first computational circuit including one or more first strings, each of the first strings having one or more first magnetoresistive effect elements provided on a first conducting layer; a second computational circuit including one or more second strings, each of the second strings having one or more second magnetoresistive effect elements provided on a second conducting layer; a third computational circuit configured to execute computational processing using a first signal from the first computational circuit and a second signal from the second computational circuit; and a control circuit configured to control the first, second, and third computational circuits. The control circuit sets a condition on write operations with respect to at least one of the first and second magnetoresistive effect elements, based on information related to write error in at least one of the first and second magnetoresistive effect elements.

(1) First Embodiment

FIGS. 1 to 23 will be referenced to describe an arithmetic device and a control method for the same according to the first embodiment.

(1a) Basic Configuration

Figure 1:
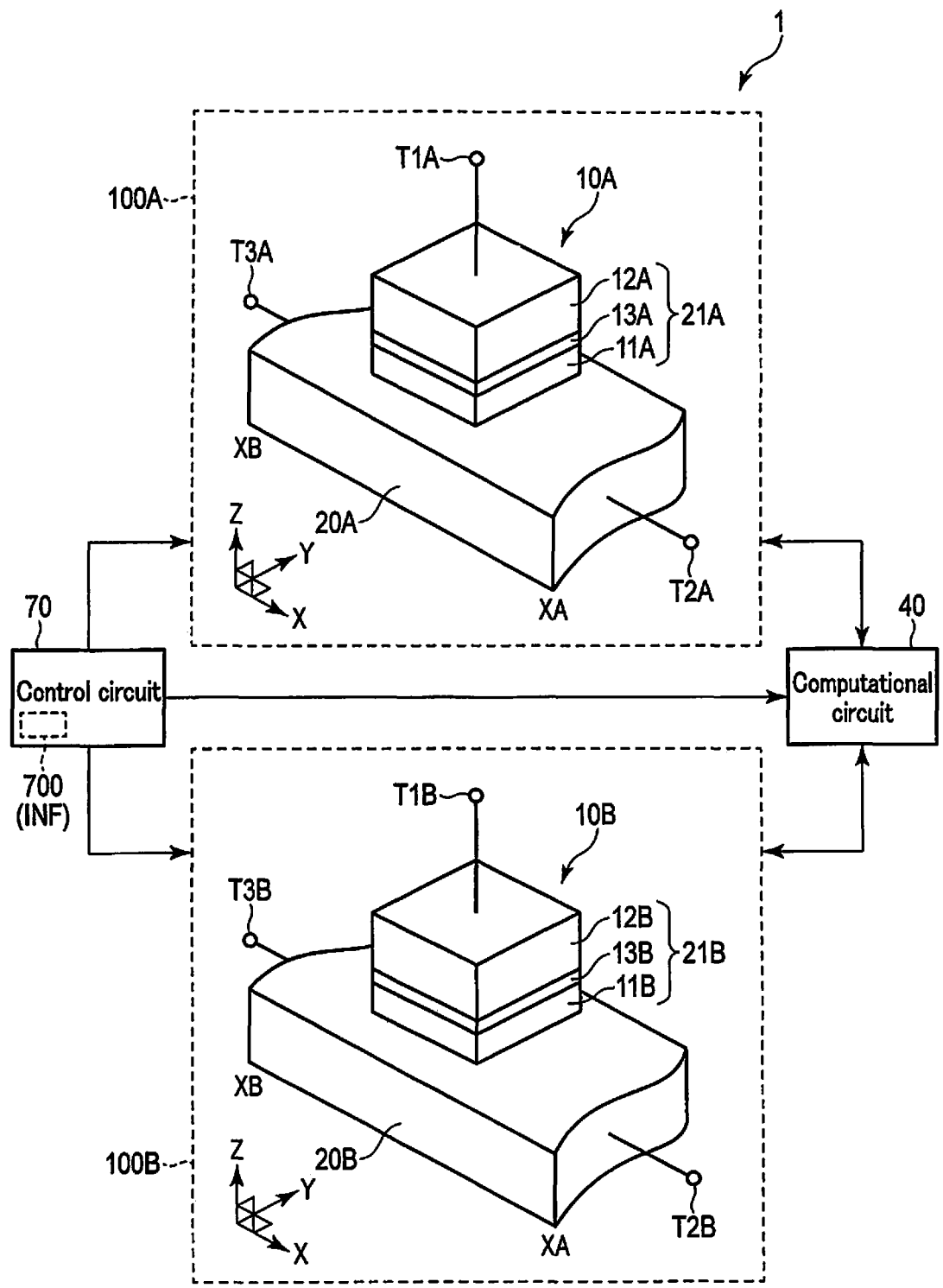
FIG. 1 is a diagram illustrating a basic configuration of an arithmetic device according to a first embodiment.

FIG. 1 will be used to describe a basic configuration of the arithmetic device according to the present embodiment.

FIG. 1 is a diagram illustrating an exemplary basic configuration of the arithmetic device according to the present embodiment.

As illustrated in FIG. 1, an arithmetic device (for example, an arithmetic logic device) 1 according to the present embodiment includes computational elements 10 (10A, 10B), a computational circuit 40, and a control circuit 70.

The computational element 10A is provided inside a first computational circuit (computational area) 100A. The computational element 10B is provided inside a second computational circuit (computational area) 100B.

The computational elements 10A and 10B have substantially the same structure.

Each computational element 10 (10A, 10B) includes a conducting layer 20 (20A, 20B), a magnetic layer 11 (11A, 11B), a non-magnetic layer 13 (13A, 13B), and a magnetic layer 12 (12A, 12B).

The magnetic layer 11, the non-magnetic layer 13, and the magnetic layer 12 are stacked on top of the conducting layer 20 in a direction perpendicular to the surface of the conducting layer 20. The computational element 10 has a structure in which a magnetoresistive effect element is provided on top of the conducting layer 20.

The magnetic layer 11 is provided between the conducting layer 20 and the non-magnetic layer 13. The non-magnetic layer 13 is provided between the two magnetic layers 11 and 12. The magnetic layer 12 is provided above the magnetic layer 11 with the non-magnetic layer 13 interposed between.

A terminal T1 (T1A, T1B) is connected to the magnetic layer 12 (12A, 12B). A terminal T2 (T2A, T2B) is connected to an end XA of the conducting layer 20 (20A, 20B). A terminal T3 (T3A, T3B) is connected to another end XB of the conducting layer 20 (20A, 20B).

In the following, the direction proceeding from the end XB of the conducting layer 20 to the other end XA of the conducting layer 20 is referred to as the X direction. Also, the direction parallel to the surface of the conducting layer 20 and intersecting with the X direction is referred to as the Y direction. The direction perpendicular to the surface of the conducting layer 20 (that is, the stacking direction of the layers 11, 12, and 13) is referred to as the Z direction. The Z direction intersects with the X and Y directions.

Each of the magnetic layers 11 and 12 is magnetized and has magnetization. For example, the magnetic layers 11 and 12 have in-plane magnetic anisotropy. The direction of magnetization in the magnetic layer 11 and the direction of magnetization in the magnetic layer 12 having in-plane magnetic anisotropy are substantially parallel to the surface of the conducting layer 20 (the surfaces of the magnetic layers 11 and 12). The magnetization directions of the magnetic layers 11 and 12 are substantially perpendicular to the stacking direction of the plurality of layers 11, 12, and 13. As an example, the direction of magnetization in the magnetic layer 11 is substantially parallel to the Y direction. The direction of the easy axis of magnetization in each of the magnetic layers 11 and 12 is the Y direction.

In the following, the magnetoresistive effect element using magnetic layers having in-plane magnetic anisotropy is referred to as an in-plane magnetization type magnetoresistive effect element.

The direction of magnetization in the magnetic layer 11 is variable. The direction of magnetization in the magnetic layer 12 is invariable (fixed-state). In the following, a magnetic layer having a variable direction of magnetization is referred to as a storage layer. In the following a magnetic layer having an invariable (fixed-state) direction of magnetization is referred to as a reference layer.

Note that in the present embodiment, "the direction of magnetization in the reference layer is invariable" or "the direction of magnetization in the reference layer is fixed-state" means that, in a case where a current or a voltage for altering the direction of magnetization in the storage layer is supplied to the computational element 10 (for example, the conducting layer 20), the direction of magnetization in the reference layer remains unchanged before and after the supply of the current/voltage.

The magnetic layer 11, the magnetic layer 12, and the non-magnetic layer 13 form a magnetic tunnel junction (MTJ). In the following, in the computational element 10 (10A, 10B), the element (magnetoresistive effect element) that includes the magnetic layer 11, the magnetic layer 12, and the non-magnetic layer 13 is referred to as the MTJ element.

As described later, the computational element 10 can control the magnetization alignment state (data holding state) of an MTJ element 21 according to the application of a voltage with respect to the terminal T1 (reference layer 12) and supply of a current with respect to the conducting layer 20. Thereby, the computational element 10 can execute computational processing (for example, logic operations).

The computational circuit 40 uses computational results from the computational element 10 to execute computational processing.

The control circuit 70 controls the operations of the computational element 10 and the operations of the computational circuit 40.

With the configuration described above, the arithmetic logic device 1 according to the present embodiment is a device capable of executing a product operation on two values.

The arithmetic logic device 1 according to the present embodiment includes a storage area 700 for holding information INF related to computational processing by the computational element 10 (write operations by the MTJ element) and the event probability of operating errors. On the basis of the information INF, the arithmetic logic device 1 according to the present embodiment sets conditions on the voltage/current supplied to the computational element 10 during computational processing.

With this arrangement, the arithmetic logic device 1 according to the present embodiment can reduce power consumption while also satisfying a tolerance value regarding the event probability of operating errors.

Consequently, the properties of the arithmetic logic device 1 according to the present embodiment can be improved.

(1b) Principles

FIGS. 2 to 8 will be referenced to describe various principles used in the operation of the computational element (magnetoresistive effect element) in the arithmetic logic device according to the present embodiment.

<Magnetoresistive Effect>

Figure 2:
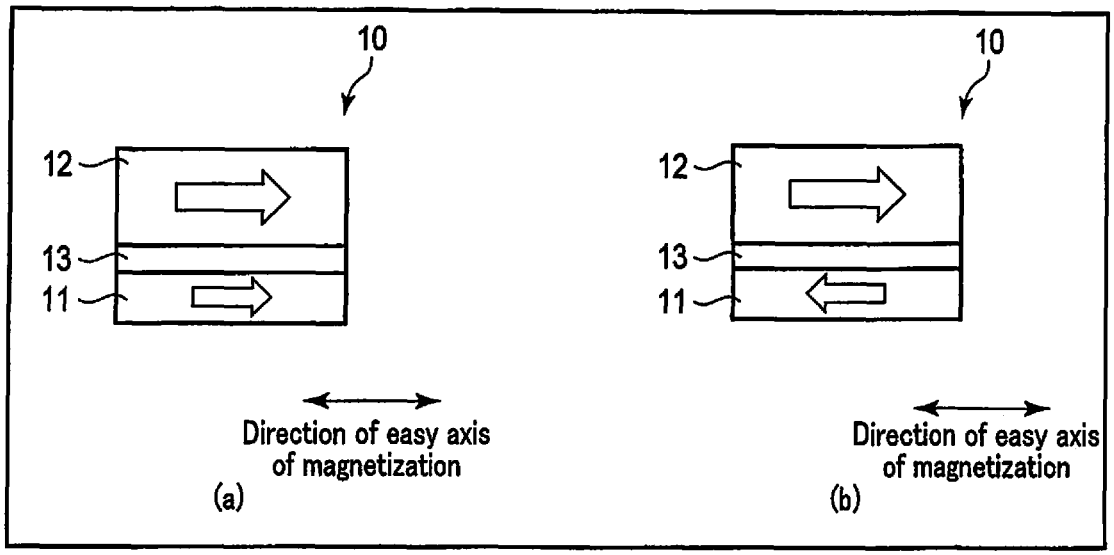

FIG. 2 is diagrams for explaining the magnetoresistive effect element (MTJ element) inside the computational element in the arithmetic logic device according to the present embodiment.

In FIG. 2, (a) is a diagram that schematically illustrates the magnetization alignment state of the magnetoresistive effect element in the case where the magnetoresistive effect element is in a first resistance state. In FIG. 2, (b) is a diagram that schematically illustrates the magnetization alignment state of the magnetoresistive effect element in the case where the magnetoresistive effect element is in a second resistance state.

As described above, the MTJ element 21 inside the computational element 10 is an in-plane magnetization type MTJ element.

The resistance state (resistance value) of the MTJ element 21 changes according to the relative relationship (magnetization alignment) between the direction of magnetization in the storage layer 11 and the direction of magnetization in the reference layer 12.

As illustrated in (a) of FIG. 2, in the case where the direction of magnetization in the storage layer 11 is the same as the direction of magnetization in the reference layer 12, the MTJ element 21 is in the first resistance state (first magnetization alignment state). The MTJ element 21 in the first resistance state has a resistance value Rp.

As illustrated in (b) of FIG. 2, in the case where the direction of magnetization in the storage layer 11 is the opposite of the direction of magnetization in the reference layer 12, the MTJ element 21 is in the second resistance state (second magnetization alignment state). The MTJ element 21 in the second resistance state has a resistance value Rap. The resistance value Rap is higher than the resistance value Rp.

In this way, the MTJ element 21 may take either a low-resistance state or a high-resistance state, depending on the magnetization alignment of the two magnetic layers 11 and 12.

The magnetoresistive effect is a phenomenon in which the resistance value changes depending on the relative relationship of the direction of magnetization in the two magnetic layers 11 and 12 as above.

For example, the MTJ element 21 holds 1-bit data ("0" data and "1" data). In this case, when the resistance state of the MTJ element 21 is set to the first resistance state, a memory cell MC is set to a first data holding state (for example, a "0" data holding state). When the resistance state of the MTJ element 21 is set to the second resistance state, the memory cell MC is set to a second data holding state (for example, a "1" data holding state).

In the present embodiment, the magnetization alignment state in the MTJ element 21 in which the direction of magnetization in the storage layer 11 and the direction of magnetization in the reference layer 12 are the same is referred to as the parallel state (or P state). The magnetization alignment state in the MTJ element 21 in which the direction of magnetization in the storage layer 11 and the direction of magnetization in the reference layer 12 are the opposite is also referred to as the antiparallel state (or AP state).

As below, in the present embodiment, to control the magnetization alignment (P/AP state) of the MTJ element 21, the spin Hall effect and voltage-controlled magnetic anisotropy (hereinafter also referred to as the voltage effect) are used.

<Spin Hall Effect>

Figure 3:
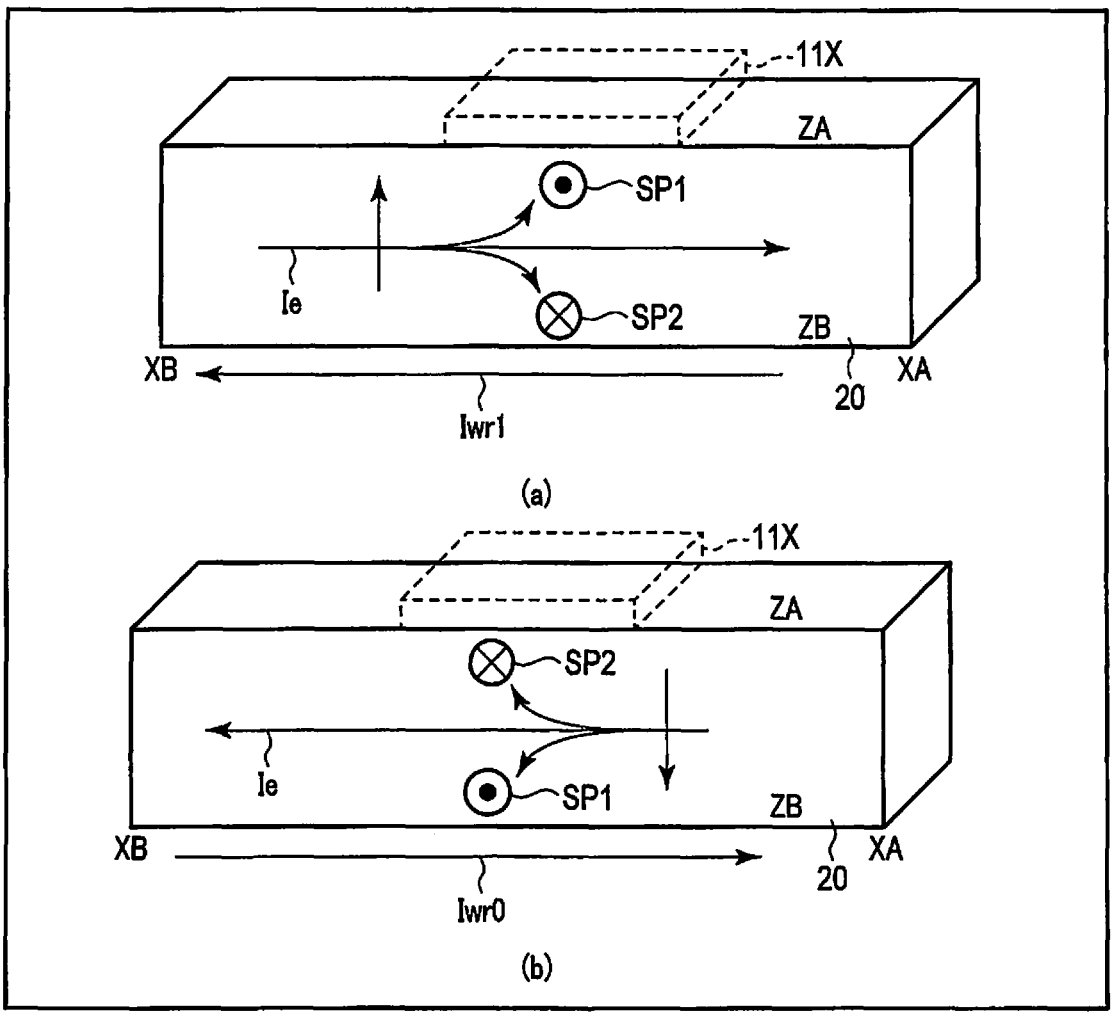

FIG. 3 will be used to describe the spin Hall effect used in the arithmetic logic device according to the present embodiment.

In FIG. 3, (a) and (b) are schematic diagrams for explaining the spin Hall effect. In (a) and (b) of FIG. 3, the MTJ element 21 is provided on a face on a "ZA" side of the conducting layer 20 (hereinafter referred to as the front face of the conducting layer 20).

In the arithmetic logic device according to the present embodiment, the spin Hall effect (or spin-orbit torque (SOT)) is used for magnetization switching (magnetization reversal) of a storage layer 11X of the MTJ element 21.

For example, for the spin Hall effect to be manifested, a material having spin-orbit coupling is used.

In (a) and (b) of FIG. 3, the conducting layer 20 is formed from a material with strong spin-orbit coupling. For example, the conducting layer 20 is a layer formed from at least one material selected from the group consisting of metals such as copper (Cu), rhodium (Rh), palladium (Pd), silver (Ag), hafnium (Hf), tantalum (Ta), tungsten (W), rhenium (Re), osmium (Os), iridium (Ir), platinum (Pt), gold (Au), and bismuth (Bi), oxides containing one or more of the above metals, and nitrides containing one or more of the above metals.

In the case where a magnetic layer 11X is in contact with the layer 20, stronger spin-orbit coupling may occur inside the layer 20. However, the conducting layer 20 is not limited to the above materials insofar as the material-used has strong spin-orbit coupling.

In the following, the conducting layer 20 is also referred to as the spin-orbit coupling layer (SO layer).

A current Iwr (Iwr1, Iwr2) is supplied to the conducting layer 20. The current (write current) Iwr has charge (electrons) with an upward spin SP1 and charge with a downward spin SP2.

In the case where the current Iwr flows through the conducting layer 20, the upward spin SP1 and the downward spin SP2 are scattered in opposing directions according to the direction in which the current is flowing (the direction of spin).

The relationship between the spin (denoted "S"), the spin current (denoted "Is"), and the electron current (denoted "Ie") is expressed by the following (Formula A). Note that the direction of the electron current "Ie" is the opposite of the direction in which the current Iwr flows. Also, "S" is a vector.

$$Is \propto S \times Ie$$ (Formula A)

As expressed in (Formula A), the spin current "Is" is proportional to the vector product of the spin "S" and the electron current "Ie".

With this arrangement, the spin current Is is produced inside the conducting layer 20 with spin-orbit coupling. The phenomenon producing such spin current Is is called the spin Hall effect.

By causing the current Iwr to flow through the conducting layer 20, the spin current Is is produced inside the conducting layer 20.

For example, as illustrated in (a) of FIG. 3, in the case where the current Iwr1 flows from one end XA side to the other end XB side of the conducting layer 20 in the diagram, the upward spin SP1 scatters toward the front face ZA side of the conducting layer 20 (the face side on which the magnetic layer 11 is provided), while the downward spin SP2 scatters toward a back face ZB side of the conducting layer 20.

For example, as illustrated in (b) of FIG. 3, in the case where a current Iwr0 flows from one end XB side to the other end XA side of the conducting layer 20 in the diagram, the upward spin SP1 scatters toward the back face ZB side of the conducting layer 20, while the downward spin SP2 scatters toward the front face ZA side of the conducting layer 20.

As illustrated in (a) and (b) of FIG. 3, by reversing the polarity (the direction of current flow) of the current Iwr energizing the conducting layer 20, the direction of the spin torque acting on the storage layer 11, of the MTJ element 21 on top of the conducting layer 20 is reversed.

The spin-orbit torque (SOT) arising from the spin current Is produced by the spin Hall effect is applied to the MTJ element 21 on top of the conducting layer 20.

The direction of the spin acting on the storage layer 11 as the spin-orbit torque changes according to the direction of the current Iwr flowing through the conducting layer 20.

Consequently, by controlling the direction of the current Iwr flowing through the conducting layer 20, the direction of magnetization in the storage layer 11 may be controlled to be a parallel direction or an antiparallel direction with respect to the direction of magnetization in the reference layer 12.

In this way, in MRAM according to the present embodiment, the spin Hall effect can be used to change (reverse, switch) the direction of magnetization in the storage layer 11 of the MTJ element 21 according to the direction of applied spin.

Magnetization switching (data writing) in the MTJ element using the spin Hall effect is capable of reversing the magnetization of the storage layer 11 without causing current to flow directly through the tunnel barrier layer 13. Consequently, in the device using the spin Hall effect, breakdown of the tunnel barrier layer 13 can be suppressed.

Also, in the magnetization switching in the MTJ element using the spin Hall effect, the path of current in a write operation of the MTJ element is different from the path of current in a read operation of the MTJ element. Consequently, in the case where the spin Hall effect is used for magnetization switching of the storage layer, read disturb substantially does not occur in the MTJ element.

<Voltage-Controlled Magnetic Anisotropy>

FIG. 4 will be referenced to describe voltage-controlled magnetic anisotropy of a magnetoresistive effect element in the arithmetic logic device according to the present embodiment.

As below, the arithmetic logic device according to the present embodiment controls the writing/non-writing of data (magnetization switching of the storage layer) with respect to the MTJ element 21 on top of the conducting layer 20 by voltage-controlled magnetic anisotropy (VCMA).

VCMA (the voltage effect) is a phenomenon in which applying a voltage between the storage layer 11 and the reference layer 12 of the MTJ element 21 causes the magnetic anisotropy energy of the storage layer 11 (for example, the perpendicular magnetic anisotropy) to change.

By causing the perpendicular magnetic anisotropy of the storage layer 11 to change, the energy barrier between the parallel state (P state) and the antiparallel state (AP state) in the MTJ element 21 changes.

With this arrangement, it is possible to control the increase and decrease of a magnetization switching current (magnetization switching threshold value) Ic of the MTJ element. Herein, the magnetization switching current/magnetization switching threshold value is the current value of a current that produces a spin-orbit torque (spin current) capable of switching the direction of magnetization in the storage layer of the MTJ element to be written to.

For example, as illustrated in FIG. 4, in an in-plane magnetization type MTJ element, the direction of magnetization in the storage layer 11 and the reference layer 12 is parallel to the layer plane (film plane) of the magnetic layers 11 and 12.

In the in-plane magnetization type MTJ element 21, in the case where a voltage VCNT is applied to the MTJ element 21 through the terminal T1 such that the perpendicular magnetic anisotropy energy of the storage layer 11 increases (becomes close to a perpendicular stable state), the magnetization switching threshold value Ic of the storage layer 11 decreases as a result of a relative decrease in the in-plane magnetic anisotropy energy.

Conversely, in the case where the voltage VCNT is applied to decrease the perpendicular magnetic anisotropy energy of the storage layer 11 (further stabilize the in-plane magnetization), the magnetization switching threshold value Ic of the storage layer 11 increases.

Note that in a case where perpendicular magnetization film is used for the MTJ element, the relationship between the perpendicular magnetic anisotropy energy and the voltage in the perpendicular magnetization type MTJ element is the inverse of the relationship between the perpendicular magnetic anisotropy energy and the voltage in an in-plane magnetization film type MTJ element.

The increase or decrease of the magnetization switching threshold value Ic due to the application of a voltage is determined according to the polarity of the voltage applied to the MTJ element (hereinafter also referred to as the MTJ voltage or the control voltage). Herein, the MTJ voltage is the potential difference between the potential of the conducting layer 20 (the potential on the storage layer side) and the potential of the terminal T1 in the upper portion of the MTJ element 21 (the potential on the reference layer side), based on the potential on the conducting layer 20 side in the lower portion of the MTJ element 21.

For instance, in an in-plane magnetization type MTJ element as an example, a CoFeB layer is used for the storage layer while a MgO layer is used for the tunnel barrier layer.

As illustrated in (a) of FIG. 4, in the in-plane magnetization type MTJ element 21, in the case where an MTJ voltage. VCNT having a negative voltage value Va (hereinafter also denoted the voltage Va) is applied to the reference layer 12 (the case in which the potential on the storage layer side is higher than the potential on the reference layer side), the magnetization switching threshold value Ic of the storage layer 11 decreases.

In the following, the state like (a) of FIG. 4, in which the voltage VCNT with the negative voltage value Va is applied to the reference layer 12 of the MTJ element 21, is referred to as a negative bias state.

As illustrated in (b) of FIG. 4, in the in-plane magnetization type MTJ element 21, in the case where an MTJ voltage VCNT having a positive voltage value Vd (or 0 V) (hereinafter also denoted the voltage Vd) is applied to the reference layer 12 (the case in which the potential on the reference layer side is higher than the potential on the storage layer side), the magnetization switching threshold value Ic of the storage layer 11 increases.

In the following, the state like (b) of FIG. 4, in which the voltage VCNT with the positive voltage value Vd is applied to the reference layer 12 of the MTJ element 21, is referred to as a positive bias state.

With such VCMA, the change in the magnetization switching threshold value of the storage layer 11 may be used to select the magnetization switching/non-switching of the storage layer 11 when a write current is supplied to the conducting layer 20.

<Control of Magnetization Switching in Storage Layer>

On the basis of the phenomena/principles described above using FIGS. 2 to 4, magnetization switching of the MTJ element in the arithmetic logic device according to the present embodiment may be executed as follows.

Figure 5:
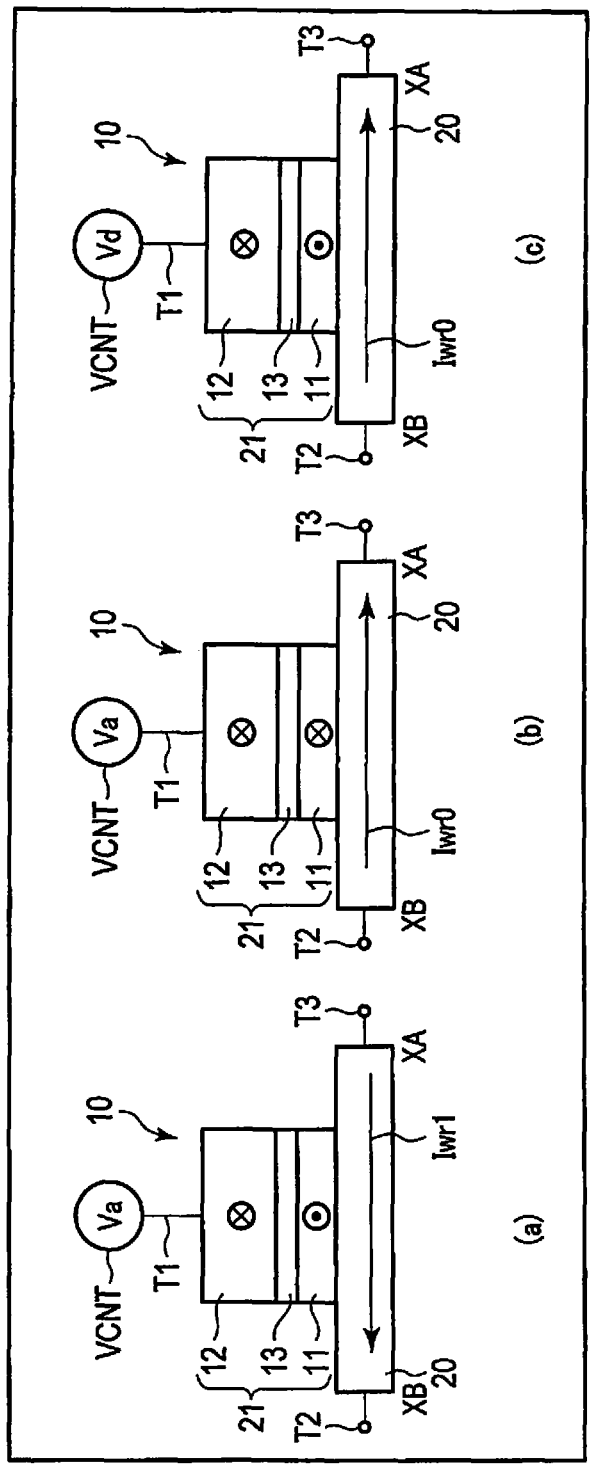

FIG. 5 is schematic diagrams for explaining a basic example of magnetization switching control of a storage layer in a magnetoresistive effect element (MTJ element) in the arithmetic logic device according to the present embodiment.

In FIG. 5, (a) and (b) are schematic diagrams for explaining magnetization switching in a storage layer of an MTJ element.

In a magnetization switching operation (write operation, compute operation) in the storage layer of the MTJ element in the arithmetic logic device according to the present embodiment, in the MTJ element to which data is to be written, an MTJ voltage Va having a predetermined polarity and voltage value is applied to the reference layer 12 of the MTJ element 21 to decrease the magnetization switching threshold value Ic of the storage layer 11 of the MTJ element 21.

While the magnetization switching threshold value Ic of the storage layer 11 is in a decreased state, the write current Iwr is supplied to the conducting layer 20 such that the direction in which the write current Iwr flows corresponds to the direction of magnetization of the storage layer 11 to be switched.

With this arrangement, spin caused by the spin Hall effect is applied to the MTJ element 21 on top of the conducting layer 20, and the direction of magnetization in the storage layer 11 switches (reverses).

As illustrated in (a) of FIG. 5, in the case where the magnetization alignment of the MTJ element is set to the AP state (for example, in the case where "1" data is written to the MTJ element 21), an MTJ voltage VCNT with a negative voltage value (select voltage Va) is applied to the reference layer 12 of the MTJ element 21 such that the potential on the reference layer side of the MTJ element 21 becomes lower than the potential on the storage layer side. With this arrangement, the MTJ element 21 is set to the negative bias state.

For example, the write current Iwr1 is supplied to the conducting layer 20 such that the write current Iwr1 flows from the terminal T3 to the terminal T2 of the conducting layer 20.

With this arrangement, the MTJ element 21 on top of the conducting layer 20 is set to the AP state (a "1" data holding state).

In the following, the current for changing the magnetization alignment of the MTJ element from the P state to the AP state is also referred to as the AP write current Iap. In the following, the operation of supplying the AP write current Iap to the computational element 10 (conducting layer 20) is also referred to as an AP write.

As illustrated in (b) of FIG. 5, in the case where the magnetization alignment of the MTJ element is set to the P state (for example, in the case where "0" data is written to the MTJ element 21), an MTJ voltage VCNT with a negative voltage value (select voltage Va) is applied to the reference layer 12 of the MTJ element 21 such that the potential on the reference layer side of the MTJ element 21 becomes lower than the potential on the storage layer side. With this arrangement, the MTJ element 21 is set to the negative bias state.

For example, the write current Iwr0 is supplied to the conducting layer 20 such that the write current Iwr0 flows from the terminal T2 to the terminal T3 of the conducting layer 20.

With this arrangement, the MTJ element 21 on top of the conducting layer 20 is set to the P state (a "0" data holding state).

In the following, the current for changing the magnetization alignment of the MTJ element from the AP state to the P state is also referred to as the P write current Ip. In the following, the operation of supplying the P write current Ip to the computational element 10 (conducting layer 20) is also referred to as a P write.

In FIG. 5, (c) is a schematic diagram for explaining the prevention (suppression) of magnetization switching in the storage layer of the MTJ element.

As illustrated in (c) of FIG. 5, in the case where magnetization switching in the storage layer of the MTJ element 21 is prevented (in the case where the MTJ element 21 is set to an unselected state), an MTJ voltage VCNT with a positive voltage value Vd (unselect voltage Vd) is applied to the reference layer 12 of the MTJ element 21 such that the potential on the reference layer side of the MTJ element 21 becomes higher than the potential on the storage layer side. With this arrangement, the MTJ element 21 is set to the positive bias state.

With this arrangement, the magnetization switching threshold value of the storage layer 11 of the MTJ element 21 rises.

Consequently, even if the write current Iwr2 (or the write current Iwr1) flows through the conducting layer 20, magnetization switching of the storage layer 11 does not occur in the MTJ element 21 in the positive bias state.

In this way, magnetization switching of the storage layer of the MTJ element 21 on top of the conducting layer 20 may be controlled by the spin Hall effect and VCMA.

For example, in a structure in which a plurality of MTJ elements 21 are disposed on top of a single conducting layer 20, a magnetization switching operation (write operation) is executed all together on the plurality of MTJ elements 21 by the spin Hall effect. In the case where the current Iwr is flowed through the conducting layer 20, elements targeted for magnetization switching (selected elements) and elements not targeted for magnetization switching (unselected elements) may exist among the plurality of MTJ elements 21 on top of the conducting layer 20 in some cases. Through VCMA of the MTJ elements, even if the write current Iwr is flowing through the conducting layer 20, magnetization switching of the storage layer in the unselected elements may be prevented (suppressed) while still switching the magnetization of the storage layer in the selected elements.

With this arrangement, in the arithmetic logic device according to the present embodiment, a reduction in the write energy (for example, the power consumption) per bit and a shrinking of the cell size can be achieved.

In the present embodiment, memory that executes write operations according to these principles is referred to as voltage control spintronic memory (VoCSM) or voltage control magnetic memory. Also, a device that executes logic operations according to these principles is referred to as voltage control spintronic logic (VoCSL).

(1c) Computational Element

FIGS. 6 to 8 will be used to describe properties of the computational element of the arithmetic logic device according to the present embodiment.

In the arithmetic logic device according to the present embodiment, the computational element 10 including the MTJ element 21 functions as a logic operation element.

FIG. 6 is a diagram illustrating a correspondence relationship between a control voltage, an initial state of magnetization alignment, and a magnetization switching result in the case where the write current of an AP write is supplied to the computational element of the arithmetic logic device according to the present embodiment.

In FIG. 6, the initial state of magnetization alignment in the MTJ element is labeled "A", and the polarity of the control voltage applied to the MTJ element is labeled "B". The computational result in the case where an AP write is executed in the computational element is labeled "Q1". Note that the initial state of magnetization alignment in the MTJ element is the magnetization alignment state in the MTJ element before the write current is supplied to the conducting layer at a computational operation.

In the case where the AP write current is supplied to the conducting layer 20 in a state where the positive voltage value (unselect voltage) Vd is applied to the MTJ element 21 in the P state, the MTJ element 21 maintains the P state.

In the case where the AP write current is supplied to the conducting layer 20 in a state where the negative voltage value (select voltage) Va is applied to the MTJ element 21 in the P state, the MTJ element 21 is set to the AP state. In the case where the AP write current is supplied to the conducting layer 20 in a state where the positive voltage value Vd is applied to the MTJ element 21 in the AP state, the MTJ element 21 maintains the AP state.

In the case where the AP write current is supplied to the conducting layer 20 in a state where the negative voltage value Va is applied to the MTJ element 21 in the AP state, the MTJ element 21 maintains the AP state.

Herein, the P state of the MTJ element is associated with "0", while the AP state of the MTJ element is associated with "1". In the control voltage VCNT, the positive voltage value Vd is associated with "0" while the negative voltage value Va is associated with "1".

In this way, in the case in which the magnetization alignment state and the control voltage polarity of the MTJ element are replaced with "0" and "1", respectively, the AP write with respect to the MTJ element 21 can obtain a result equivalent to performing an OR operation on the initial state "A" of the magnetization alignment in the MTJ element and the polarity "B" set for the control voltage VCNT.

FIG. 7 is a diagram illustrating a correspondence relationship between a control voltage, an initial state of magnetization alignment, and a magnetization switching result in the case where the write current of a P write is supplied to the computational element of the arithmetic logic device according to the present embodiment.

In FIG. 7, the initial state of magnetization alignment in the MTJ element (the magnetization alignment state of the MTJ element before the write current is supplied) is labeled "A", and the polarity of the control voltage applied to the MTJ element is labeled "B". The computational result in the case where a P write is executed in the computational element is labeled "Q2".

In the case where the P write current Ip is supplied to the conducting layer 20 in a state where the positive voltage value (unselect voltage) Vd is applied to the MTJ element 21 in the P state, the MTJ element 21 maintains the P state. In the case where the P write current Ip is supplied to the conducting layer 20 in a state where the negative voltage value (select voltage) Va is applied to the MTJ element 21 in the P state, the MTJ element 21 maintains the P state. In the case where the P write current Ip is supplied to the conducting layer 20 in a state where the positive voltage value Vd is applied to the MTJ element 21 in the AP state, the MTJ element 21 maintains the AP state.

In the case where the P write current Ip is supplied to the conducting layer 20 in a state where the negative voltage value Va is applied to the MTJ element 21 in the AP state, the MTJ element 21 is set to the P state.

In the case in which the magnetization alignment state and the control voltage polarity of the MTJ element, are replaced with "0/1", respectively, the P write with respect to the MTJ element 21 can obtain a result equivalent to performing an AND operation on the initial state "A" of the magnetization alignment in the MTJ element and an inverted value "bB" of the polarity ("B") set for the control voltage VCNT.

FIG. 8 is a diagram for explaining a computational processing using the result of an AP write and the result of a P write in the computational element in the arithmetic logic device according to the present embodiment.

In FIG. 8, in the case where the value of the result Q1 of the OR operation (AP write) is the same as the value of the result Q2 of the AND operation (P write), the result of the computation using the two results Q1 and Q1 is treated as "1". In the case where the value of the result Q1 of the OR operation (AP write) is different from the value of the result Q2 of the AND operation (P write), the result of the computation using the two results Q1 and Q2 is treated as "0".

In this way, the arithmetic logic device according to the present embodiment can use the result "Q1" of the OR operation (AP write) and the result "Q2" of the AND operation (P write) to obtain a result equivalent to performing an XNOR operation on "A" and "B".

In this way, the arithmetic logic device 1 according to the present embodiment can execute OR operations, AND operations, and XNOR operations on two values (two pieces of data).

In the following, computational processing using the computational element 10 is substantially the same as a data write to the MTJ element 21 inside the computational element 10. In the following, computational processing using the computational element 10 is also referred to as a write operation (or a data write).

(1d) Exemplary Configuration

Figure 9:
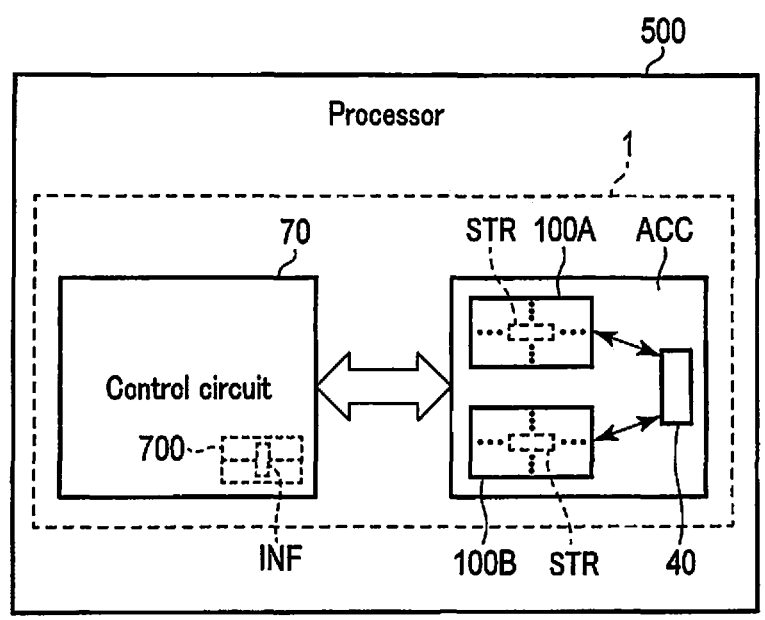
FIGS. 9, 10, 11, 12, 13, 14, and 15 are diagrams illustrating an exemplary configuration of the arithmetic device according to the first embodiment.

FIG. 9 will be referenced to describe an exemplary configuration of the arithmetic logic device according to the present embodiment.

FIG. 9 is a schematic diagram illustrating a more specific exemplary configuration of the arithmetic logic device according to the present embodiment.

As illustrated in FIG. 9, the arithmetic logic device 1 according to the present embodiment is provided inside a processor 500.

As described earlier, the arithmetic logic device 1 includes the computational circuits 100A, 100B, and 40 as well as the control circuit 70.

Each computational circuit 100 (100A, 100B) includes a plurality of strings STR. The strings STR, which act as the units of control (units of selection), include a plurality of computational elements 10. The configuration of the strings STR will be described later. For example, the computational circuits 100A, 100B, and 40 form a high-speed operation circuit (accelerator) ACC.

The control circuit 70 controls the operations of the high-speed operation circuit ACC. The control circuit 70 can control the operations of each of the computational circuits 100A, 100B, and 40. The control circuit 70 includes the storage area 700 capable of holding one or more pieces of information INF.

The storage area 700 is a register, for example. The information INF is information for controlling the high-speed operation circuit ACC. For example, the information INF is information related to voltage and/or current conditions used in write operations.

Figure 10:
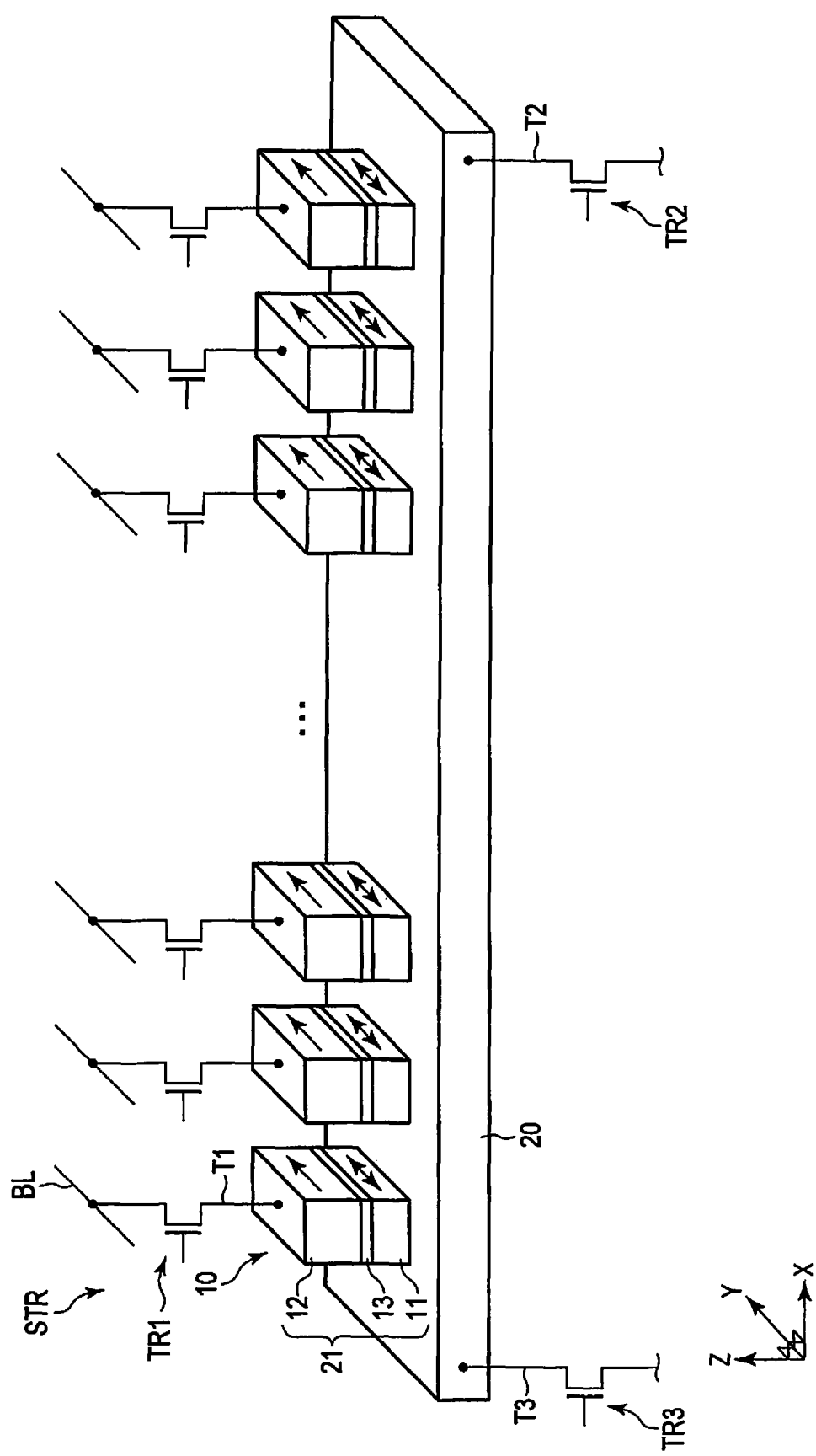

FIG. 10 is a bird's-eye view of an exemplary configuration of a unit of control (unit of selection) including computational elements in the arithmetic logic device according to the present embodiment.

As illustrated in FIG. 10, a single string STR includes the single conducting layer 20 and a plurality of MTJ elements 21.

The conducting layer 20 extends in the X direction.

The plurality of MTJ elements 21 is provided on top of the conducting layer 20. The plurality of MTJ elements 21 are arrayed in the X direction. Each MTJ element 21 is an in-plane magnetization type MTJ element. The direction of the easy axis of magnetization in the magnetic layers 11 and 12 of the MTJ elements 21 is set to the Y direction. The magnetization of the reference layer 12 proceeds from the front side of the page in the depth direction going into the page of the diagram.

Each MTJ element 21 is respectively connected to a terminal T1. In each MTJ element 21, the terminal T1 is connected to a bit line BL via a transistor TR1. By applying the control voltage VCNT to each terminal T1, the plurality of MTJ elements 21 are set to the selected state and the unselected state independently of each other.

The terminal T2 is connected to one end in the X direction of the conducting layer 20. The terminal T2 is connected to an interconnect (not illustrated) via a transistor TR2. The terminal T3 is connected to the other end in the X direction of the conducting layer 20. The terminal T3 is connected to an interconnect (not illustrated) via a transistor TR3.

The single conducting layer 20 is shared among the plurality of MTJ elements 21. Consequently, the write current Iwr is supplied to the plurality of MTJ elements 21 at the same time.

The control terminal T1 is respectively provided for each MTJ element 21. With this arrangement, the respective MTJ elements 21 on top of the single conducting layer 20 function as mutually independent elements 10.

A plurality of strings STR are provided inside the computational circuit (computational area) 100.

Figure 11:
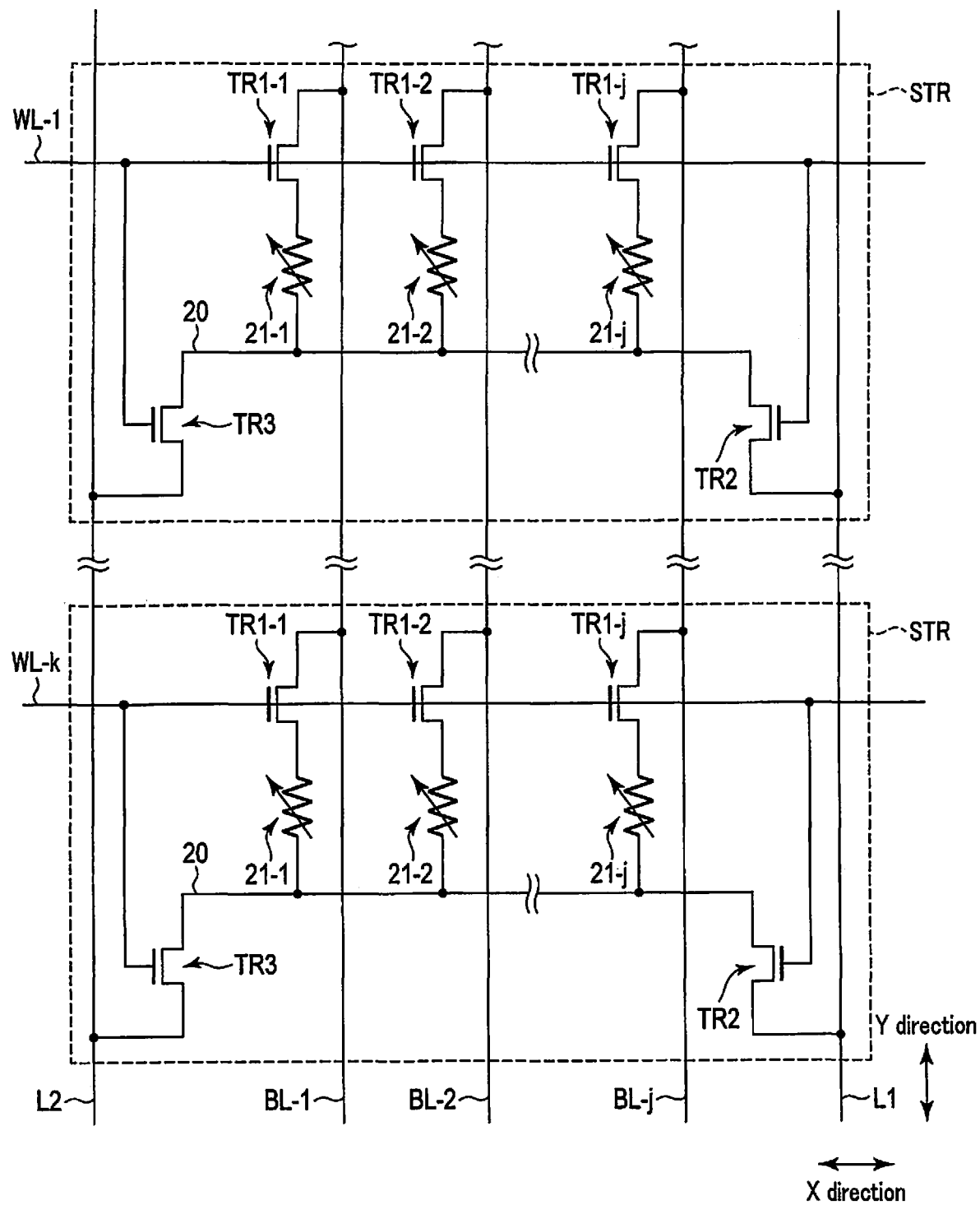

FIG. 11 is a circuit diagram illustrating one example of an internal configuration of the computational circuit 100 in the arithmetic logic device according to the present embodiment.

As illustrated in FIG. 11, a plurality of strings STR are arrayed inside the computational circuit (computational area, also referred to as a memory array tile (MAT)) 100.

The plurality of strings STR arrayed in the Y direction are connected to mutually different interconnects (hereinafter referred to as word lines) WL (WL-1, . . . , WL–k).

The plurality of strings STR arrayed in the Y direction are commonly connected to an interconnect L1 via the transistor TR2, and are commonly connected to an interconnect L2 via the transistor TR3.

The plurality of MTJ elements 21 (21-1, 21-2, . . . , 21-$j$) arrayed in the Y direction are connected to common interconnects (hereinafter referred to as bit lines) BL (BL-1, BL-2, . . . , BL-j) via the transistors TR1 (TR1-1, TR1-2, . . . , TR1-$j$). The plurality of MTJ elements 21 adjacent in the X direction are connected to mutually different interconnects BL.

For example, inside the computational circuit 100, the plurality of strings STR may be arrayed in the X direction. The plurality of strings STR arrayed in the X direction may also be connected to a common interconnect WL.

In the present embodiment, the computational circuit 100A is used as an OR operation circuit (OR operation area), while the computational circuit 100B is used as an AND operation circuit (AND operation area). Each computational circuit 100 is also used as a storage area for data used in computations.

Figure 12:
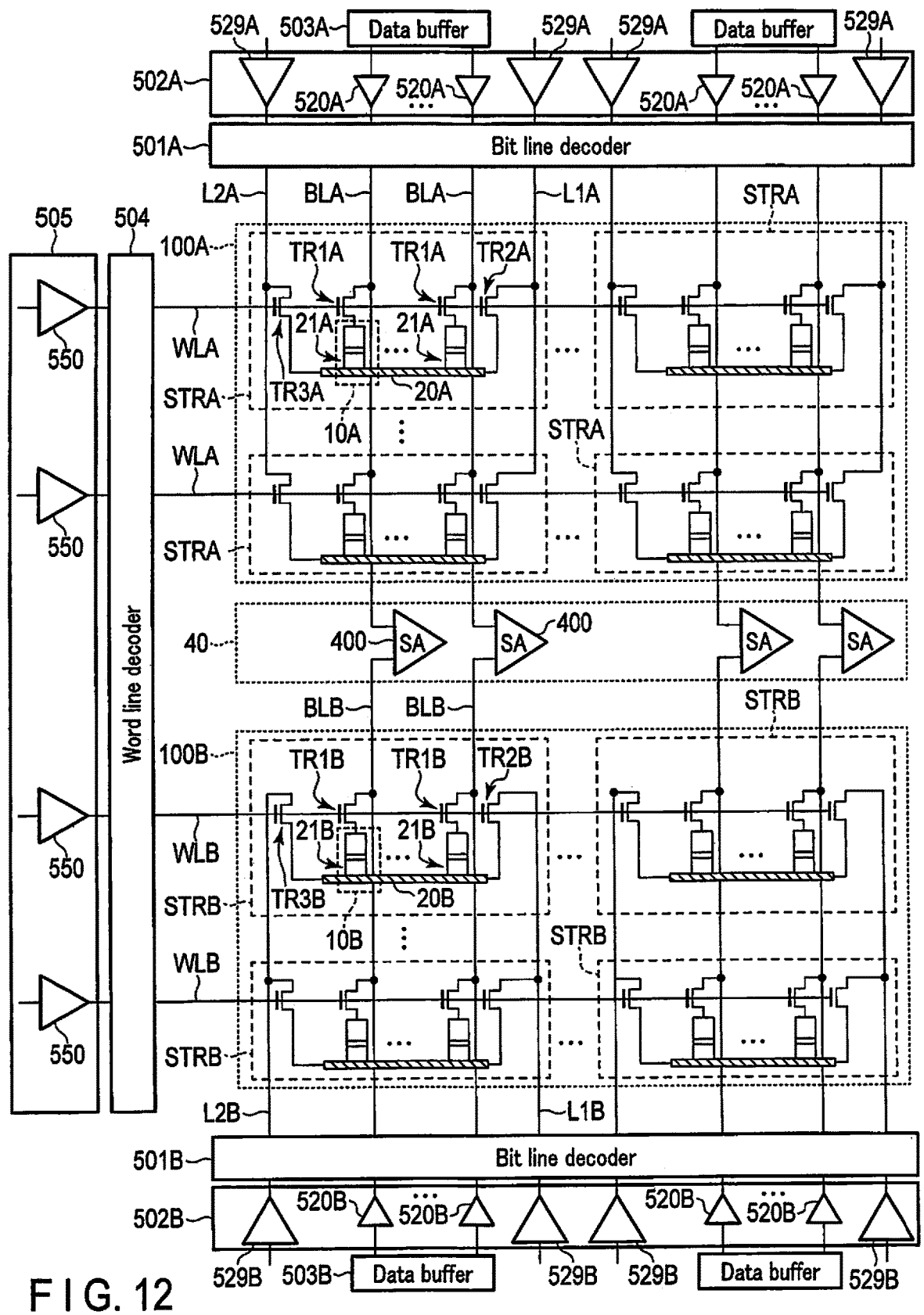

FIG. 12 is a schematic diagram illustrating one example of the internal configuration of the arithmetic logic device according to the present embodiment.

Inside the OR operation circuit 100A, a plurality of strings STRA, a plurality of word lines WLA, a plurality of bit lines BLA, and a plurality of interconnects L1A and L2A are provided.

Each word line WLA is connected, via a word line decoder 504, to a corresponding driver (driver circuit) 550 from among a plurality of drivers 550 inside a word line driver 505.

Each bit line BLA is connected, via a bit line decoder 501A, to a corresponding driver 520A from among a plurality of drivers (driver circuits) 520A inside a bit line driver 502A.

The interconnect L1A is connected, via the bit line decoder 501A, to a corresponding driver 529A from among a plurality of drivers 529A of a driver circuit 502. The interconnect L2A is connected, via the bit line decoder 501A, to a corresponding driver 529A from among the plurality of drivers 529A of the driver circuit 502.

Inside the AND operation circuit 100B, a plurality of strings STRB, a plurality of word lines WLB, a plurality of bit lines BLB, and a plurality of interconnects L1B and L2B are provided.

Each word line WLB is connected, via the word line decoder 504, to a corresponding driver (driver circuit) 550 from among the plurality of drivers 550 inside the word line driver 505.

Each bit line BLB is connected, via a bit line decoder 501B, to a corresponding driver (driver circuit) 520B from among a plurality of drivers 520B inside a bit line driver 502B.

The interconnect L1B is connected, via the bit line decoder 501B, to a corresponding driver (driver circuit) 529B from among a plurality of drivers 529B of the bit line driver 502B. The interconnect L2B is connected, via the bit line decoder 501B, to a corresponding driver 529B from among the plurality of drivers 529B of the bit line driver 502B.

As illustrated in FIG. 12, the plurality of strings STR are provided inside the circuit (area) 100. With this arrangement, massively parallel computations on data to be computed can be executed. As a result, the arithmetic logic device 1 according to the present embodiment is capable of speeding up computational processing with respect to data.

The computational circuit 40 is provided between the OR operation circuit 100A and the AND operation circuit 100B. The computational circuit 40 includes a plurality of sense amplifiers 400, for example. Each sense amplifier 400 has two input terminals.

One input terminal of each sense amplifier 400 is connected to a corresponding bit line BLA from among the plurality of bit lines BLA inside the OR operation circuit 100A. The other input terminal of each sense amplifier 400 is connected to a corresponding bit line BLB from among the plurality of bit lines BLB inside the AND operation circuit 100B.

The sense amplifiers 400 read held data in MTJ elements 21A inside the OR operation circuit 100A through the bit lines BLA. The sense amplifiers 400 read held data in MTJ elements 21B inside the AND operation circuit 100B through the bit lines BLB.

Each sense amplifier 400 compares a signal from the OR operation circuit 100A (the result of an OR operation) to a signal from the AND operation circuit 100B (the result of an AND operation). Each sense amplifier 400 outputs a comparison result of the two signals as a computational result of the computational circuit 40.

In this way, the computational circuit 40 executes computational processing equivalent to performing an XNOR operation (product operation) on two values, on the basis of a reading and comparison of the result of an OR operation (logical sum operation) and the result of an AND operation (logical product operation) by the sense amplifiers 400. In the following, the computational circuit (operation circuit) 40 is also referred to as a read circuit.

Note that the bit line driver, the bit line decoder, the word line driver, and the word line decoder may also be components of the control circuit 70.

Figure 13:
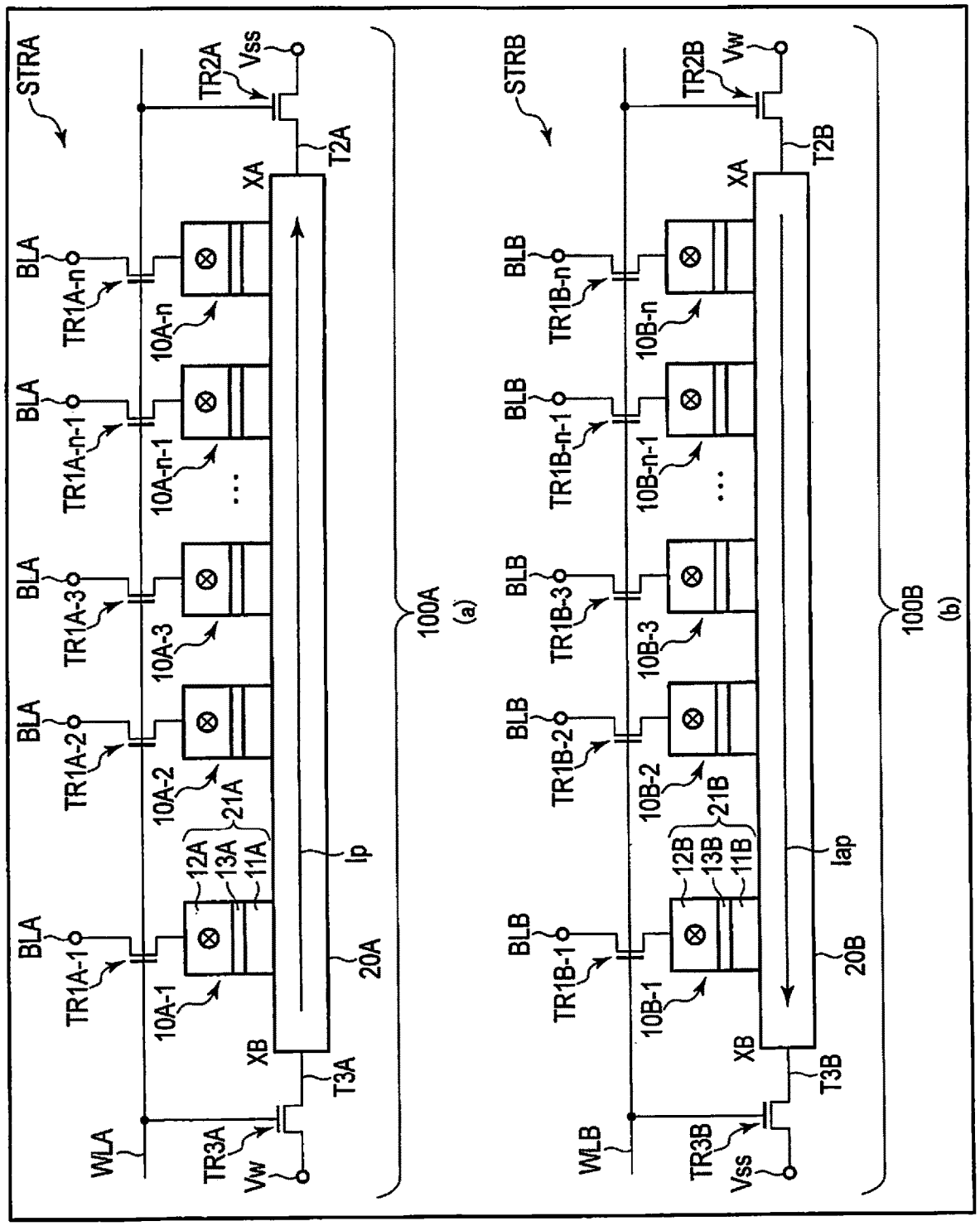

FIG. 13 is schematic diagrams illustrating one example of the configuration of the AND operation circuit and the OR operation circuit in the arithmetic logic device according to the present embodiment.

In FIG. 13, (a) illustrates an exemplary configuration of a string STR of the OR operation circuit 100A in the arithmetic logic device according to the present embodiment.

In the string STRA of the OR operation circuit 100A, the gates of the transistors TR1A, TR2A, and TR3A are connected to the word line WLA. By controlling the potential of the word line WLA, the string STRA is set to an active state (selected state) or an inactive state (unselected state).

The control terminal T1A is connected to the reference layer 12A of each MTJ element 21A. Each control terminal T1A is connected to a bit line BLA via the transistor TR1A.

By controlling the potential of the bit lines BLA, each MTJ element 21A is set to the selected state or the unselected state.

The terminal T2A of the conducting layer 20A is connected to a driver 529A via the transistor TR2A and the interconnect L1A. The terminal T3A of the conducting layer 20A is connected to a driver 529A via the transistor TR3A and the interconnect L2A.

In the OR operation circuit 100A, the P write current Ip is supplied to the conducting layer 20A. The potential difference between voltages Vw and Vss supplied from the drivers 529A causes the P write current Ip to flow through the conducting layer 20A. In this case, one driver 529A functions as a source circuit while the other driver 529A functions as a sink circuit. The one driver 529A applies a voltage Vw having a positive voltage value to the terminal T3A of the conducting layer 20A. The other driver 529A applies a ground voltage Vss to the terminal T2A of the conducting layer 20A.

In this way, the potential on the terminal T3A side of the conducting layer 20A is higher than the potential of the terminal T2A side of the conducting layer 20A. This potential difference causes the P write current Ip to flow from a part XB side to a part XA side of the conducting layer 20A.

In FIG. 13, (b) illustrates an exemplary configuration of a string of the AND operation circuit in the arithmetic logic device according to the present embodiment.

In the string STRB of the AND operation circuit 100B, the gates of the transistors TR1B, TR2B, and TR3B are connected to the word line WLB. By controlling the potential of the word line WLB, the string STRB is set to an active state (selected state) or an inactive state (unselected state).

The control terminal T1B is connected to the reference layer 12B of each MTJ element 21B. Each control terminal T1B is connected to a bit line BLB via the transistor TR1B.

By controlling the potential of the bit lines BLB, each MTJ element 21B is set to the selected state or the unselected state.

The terminal T2B of the conducting layer 20B is connected to one driver 529B via the transistor TR2B and the interconnect L1B. The terminal T3B of the conducting layer 20B is connected to the other driver 529B via the transistor TR3B and the interconnect L2B.

In the AND operation circuit 100B, the AP write current Iap is supplied to the conducting layer 20B. The voltages supplied from the drivers 529B cause the AP write current Iap to flow through the conducting layer 20B. In this case, the one driver 529B functions as a source circuit while the other driver 529B functions as a sink circuit. The one driver 529B applies the voltage Vw having a positive voltage value to the terminal T2B of the conducting layer 20B. The other driver 529B applies the ground voltage Vss to the terminal T3B of the conducting layer 20B.

In this way, the potential of the terminal T2B of the conducting layer 20B is higher than the potential of the terminal T3B of the conducting layer 20B. This potential difference causes the AP write current Iap to flow from the part XA side to the part XB side of the conducting layer 20B.

Figure 14:
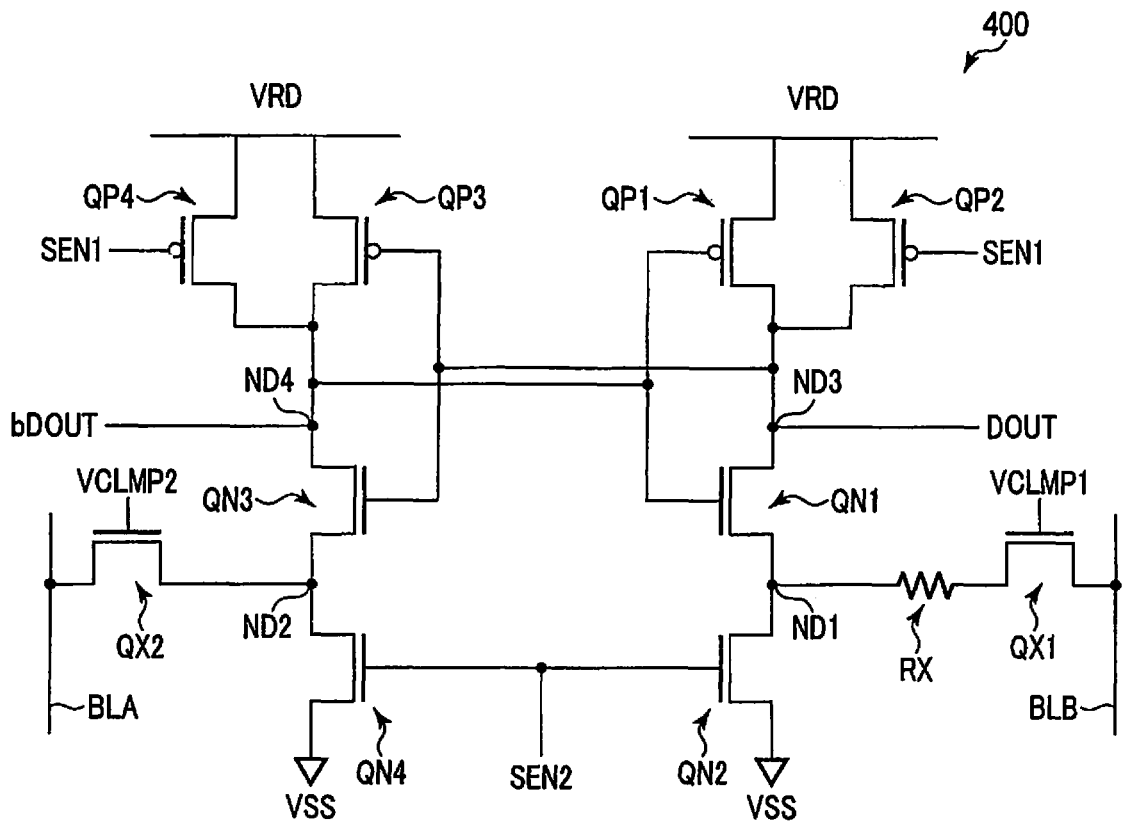

FIG. 14 is a circuit diagram illustrating one example of the configuration of a computational circuit in the arithmetic logic device according to the present embodiment.

In FIG. 14, one example of a sense amplifier inside the computational circuit (read circuit) is illustrated.

As illustrated in FIG. 14, each sense amplifier 400 in the computational circuit 40 includes a plurality of field-effect transistors (hereinafter referred to as transistors) QN and QP.

The sense amplifier 400 in the example of FIG. 14 includes four n-type transistors QN1, QN2, QN3, and QN4, and four p-type transistors QP1, QP2, QP3, and QP4.

One end (one of either the source or the drain) of the current path of the transistor QN1 is connected to a node (first input terminal) ND1. The other end (the other of either the source or the drain) of the current path of the transistor QN1 is connected to a node (second input terminal) ND3. The gate of the transistor QN1 is connected to a node ND4.

One end of the current path of the transistor QN2 is connected to a ground terminal VSS. The other end of the current path of the transistor QN2 is connected to the node ND1. A control signal SEN2 is supplied to the gate of the transistor QN2.

One end of the current path of the transistor QP1 is connected to a voltage terminal VRD. The other end of the current path of the transistor QP1 is connected to the node ND3. The gate of the transistor QP1 is connected to the gate of the transistor QN1 and the node ND4.

The current path of the transistor QP2 is connected in parallel with the current path of the transistor QP1. One end of the current path of the transistor QP2 is connected to the voltage terminal VRD. The other end of the current path of the transistor QP2 is connected to the node ND3. A control signal SEN1 is supplied to the gate of the transistor QP2.

One end of the current path of the transistor QN3 is connected to a node ND2. The other end of the current path of the transistor QN3 is connected to the node ND4. The gate of the transistor QN3 is connected to the node ND3.

One end of the current path of the transistor QN4 is connected to the ground terminal VSS. The other end of the current path of the transistor QN4 is connected to the node ND2. The control signal SEN2 is supplied to the gate of the transistor QN4.

One end of the current path of the transistor QP3 is connected to the voltage terminal VRD. The other end of the current path of the transistor QP3 is connected to the node ND4. The gate of the transistor QP3 is connected to the gate of the transistor QN3 and the node ND3.

The current path of the transistor QP4 is connected in parallel with the current path of the transistor QP3. One end of the current path of the transistor QP4 is connected to the voltage terminal VRD. The other end of the current path of the transistor QP4 is connected to the node ND4. The control signal SEN1 is supplied to the gate of the transistor QP4.

By controlling the signal levels of the control signals SEN1 and SEN2, the sense amplifier 400 is activated.

The node ND1 is connected to one of the bit lines BLB of the AND operation circuit 100B via a transistor QX1. The node ND2 is connected to one of the bit lines BLA of the OR operation circuit 100A via a transistor QX2.

For example, a gate voltage VCLMP1 is applied to the gate of the transistor QX1. A gate voltage VCLMP2 is applied to the gate of the transistor QX2. The transistors QX1 and QX2 control the connection between the operation circuits 100A/100B and the sense amplifier 400. For example, the transistors QX1 and QX2 function as clamp transistors.

An output terminal DOUT is connected to the node ND3. An output terminal bDOUT is connected to the node ND4. A signal corresponding to a comparison result is output from the output terminal DOUT. A signal corresponding to the inverted value of the comparison result is output from the output terminal bDOUT.

For example, a resistance element RX is connected between the node ND1 and the transistor QX1. The resistance element RX may also be connected between the transistor QX1 and the bit line BLA.

Note that the circuit configuration of the sense amplifier 400 is not limited to the example in FIG. 14. Any of various types of circuit configurations, such as a current-sensing type, a voltage-sensing type, or a charge-storage type, may be applied as the configuration of the sense amplifier 400.

Figure 15:
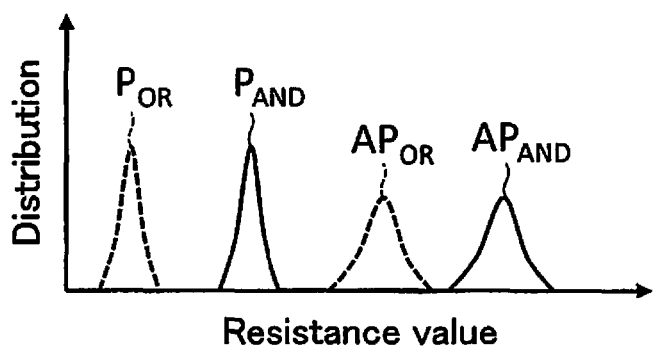

FIG. 15 is a graph illustrating one example of a distribution of resistance values in the plurality of MTJ elements inside the computational circuit in the arithmetic logic device according to the present embodiment.

In the case where the sense amplifier 400 is used to execute a process of comparing the result of an OR operation and the result of an AND operation, to simplify the comparison process, the resistance values of the MTJ elements 21B inside the AND operation circuit 100B may be raised higher than the resistance values of the MTJ elements 21A inside the OR operation circuit 100A.

In this case, as illustrated in FIG. 15, distributions $P_{AND}$ and $AP_{AND}$ of the resistance values of the plurality of MTJ elements 21B inside the AND operation circuit 100B, compared with distributions $P_{OR}$ and $AP_{OR}$ of the resistance values of the plurality of MTJ elements 21A inside the OR operation circuit 100A, are shifted in the direction of higher resistance.

The distribution $AP_{OR}$ of the resistance values of the MTJ elements in the AP state in the OR operation circuit 100A is set to exist between the distribution $P_{AND}$ of the resistance values of the MTJ elements in the P state and the distribution $AP_{AND}$ of the resistance values of the MTJ elements in the AP state in the AND operation circuit 100B.

To shift the distributions of the resistance values, the resistance element RX is provided on the path connecting the AND operation circuit 100B and the sense amplifier 400, like the exemplary circuit in FIG. 14, for example.

For example, in the case where a signal from an MTJ element holding the result of an OR operation is greater than a signal from an MTJ element holding the result of an AND operation, the determination result (output signal) of the sense amplifier 400 is treated as "1". In contrast, in the case where a signal from an MTJ element holding the result of an OR operation is equal to or less than a signal from an MTJ element holding the result of an AND operation, the determination result of the sense amplifier 400 is treated as "0".

In this way, the comparison of the signal magnitude between the result of an OR operation and the result of an AND operation by the sense amplifier 400 (computational processing, the acquisition of the result of an XNOR operation) may be achieved relatively easily.

Like the example in FIG. 14, in the case where the resistance element RX is connected between the node ND1 of the sense amplifier 400 and the bit line BLB of the AND operation circuit 100B, the signal magnitude (for example, the current value) corresponding to the result of the AND operation becomes smaller than the signal magnitude corresponding to the result of the OR operation.

With this arrangement, in the sense result of the sense amplifier 400, the distribution of the resistance values of the MTJ elements 21B of the AND operation Circuit 100B may be shifted relatively (equivalently) to higher resistance values than the distribution of the resistance values of the MTJ elements of the OR operation circuit.

By controlling the operating voltages of the transistor QX1 and the transistor QX2, the distribution of the resistance values of the MTJ elements 21B of the AND operation circuit 100B may be shifted equivalently in the direction of higher resistance compared to the distribution of the resistance values of the MTJ elements 21A of the OR operation circuit 100A. For example, the gate voltage VCLMP1 of the transistor (for example, a clamp transistor) QX1 is set lower than the gate voltage VCLMP2 of the transistor (for example, a clamp transistor) QX2. With this arrangement, the signal magnitude (for example, the current value) corresponding to the result of the AND operation becomes smaller than the signal magnitude corresponding to the result of the OR operation.

As a result, the distribution of the resistance values of the MTJ elements 21B of the AND operation circuit 100B may be shifted to higher resistance values than the distribution of the resistance values of the MTJ elements of the OR operation circuit.

Note that instead of installing the resistance element RX and controlling the gate voltages of the transistors, the size (area in the X-Y plane) of the MTJ elements 21B inside the AND operation circuit 100B may also be set larger than the size (area in the X-Y plane) of the MTJ elements 21A inside the OR operation circuit 100A.

With such a circuit configuration, the arithmetic logic device 1 according to the present embodiment can execute OR operations, AND operations, and XNOR operations on two values (pieces of data). For example, the arithmetic logic device 1 according to the present embodiment may also be referred to as an XNOR operation device (or product operation device).

(1e) Exemplary Operations

FIGS. 16 to 21 will be referenced to describe exemplary operations of the arithmetic logic device according to the present embodiment.
<Computational Processing>

FIGS. 16 to 21 are diagrams that schematically illustrate a plurality of processes (computational steps) in operations executed by the arithmetic logic device according to the present embodiment.

As illustrated in FIG. 16, in each of the computational circuits 100A and 100B, the MTJ elements 21 of the computational elements 10 are set to the initial state. In the initial state of the computational elements 10, the data (for example, values) stored inside the MTJ elements 21 of the computational elements 10 is arbitrary.

Figure 17:
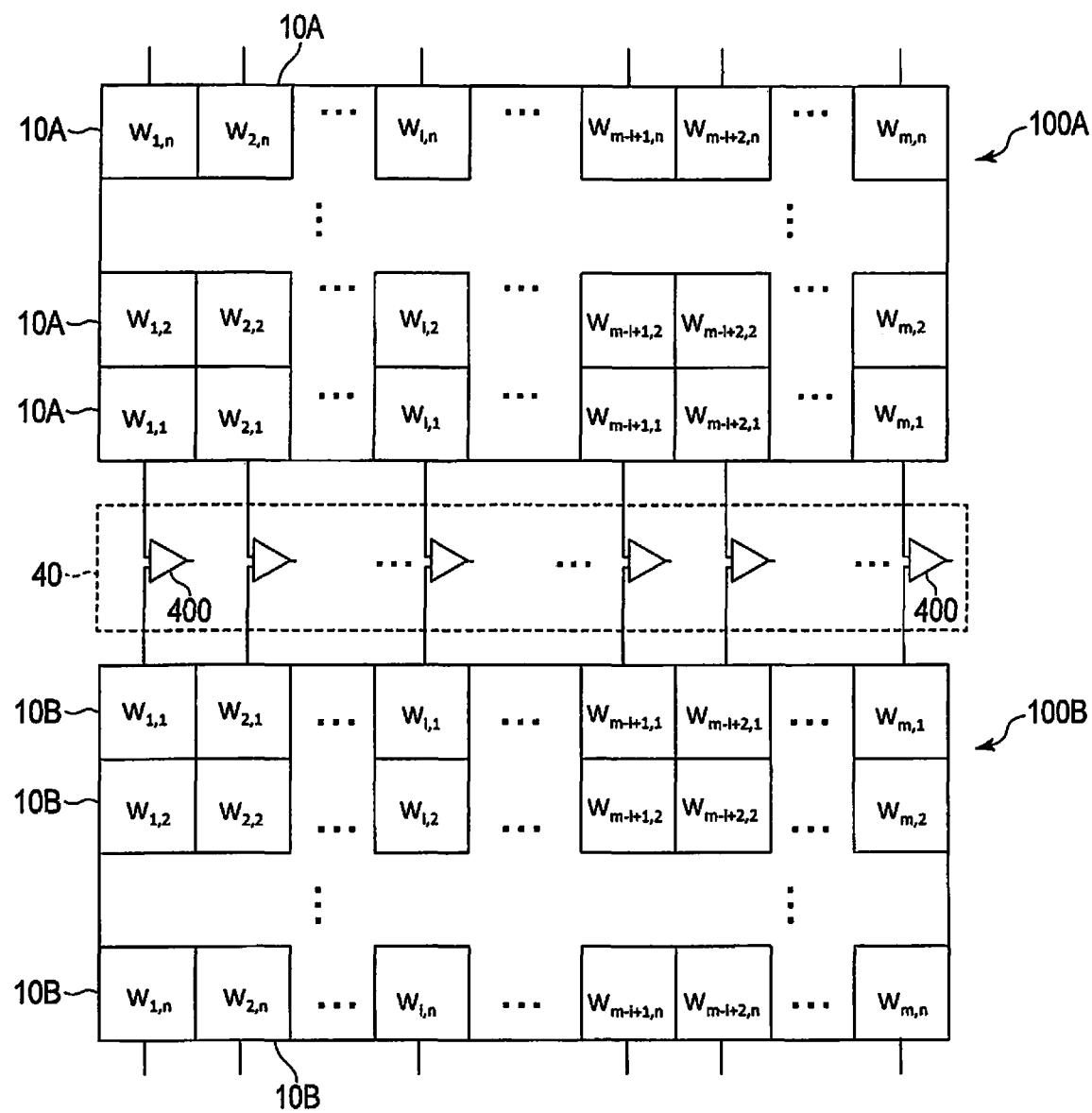

As illustrated in FIG. 17, in the computational elements 10 of each of the computational circuits 100A and 100B, weight data $W_{m,n}$ is written to the MTJ elements 21. The weight data $W_{m,n}$ expresses weighting values.

The word line driver 505 and the word line decoder 504 control the low (word line) of the AND operation circuit and the OR operation circuit. By activating/deactivating the word lines WL, the string(s) STR to write data to is selected.

By controlling the potential of one or more word lines WLA and WLB, one or more strings STRA and STRB are set to the selected state or the unselected state. The potentials of the plurality of bit lines BLA and BLB are controlled.

With this arrangement, the MTJ elements 21A and 21B are set to the selected state (writable state) or the unselected state (write-protected state).

When writing the weight data $W_{m,n}$ to the MTJ elements 21, a 0 write current and/or a 1 write current are supplied to the strings STRA and STRB according to the weight data $W_{m,n}$ to be written.

With this arrangement, "0" data or "1" data is written to each of the MTJ elements 21A and 21B.

Note that the same data (same values, same data sequence) is desirably written to symmetric positions (addresses) in the computational circuits 100A and 100B. For example, the data written to the string STRA at the j-th address in the OR operation circuit 100A is the same as the data written to the string STRB at the j-th address in the AND operation circuit 100B.

The writing of data to the string STRA at the j-th address in the OR operation circuit 100A may be executed at the same time as the writing of data to the string STRB at the j-th address in the AND operation circuit 100B, or each writing may be executed at a different timing.

Figure 18:
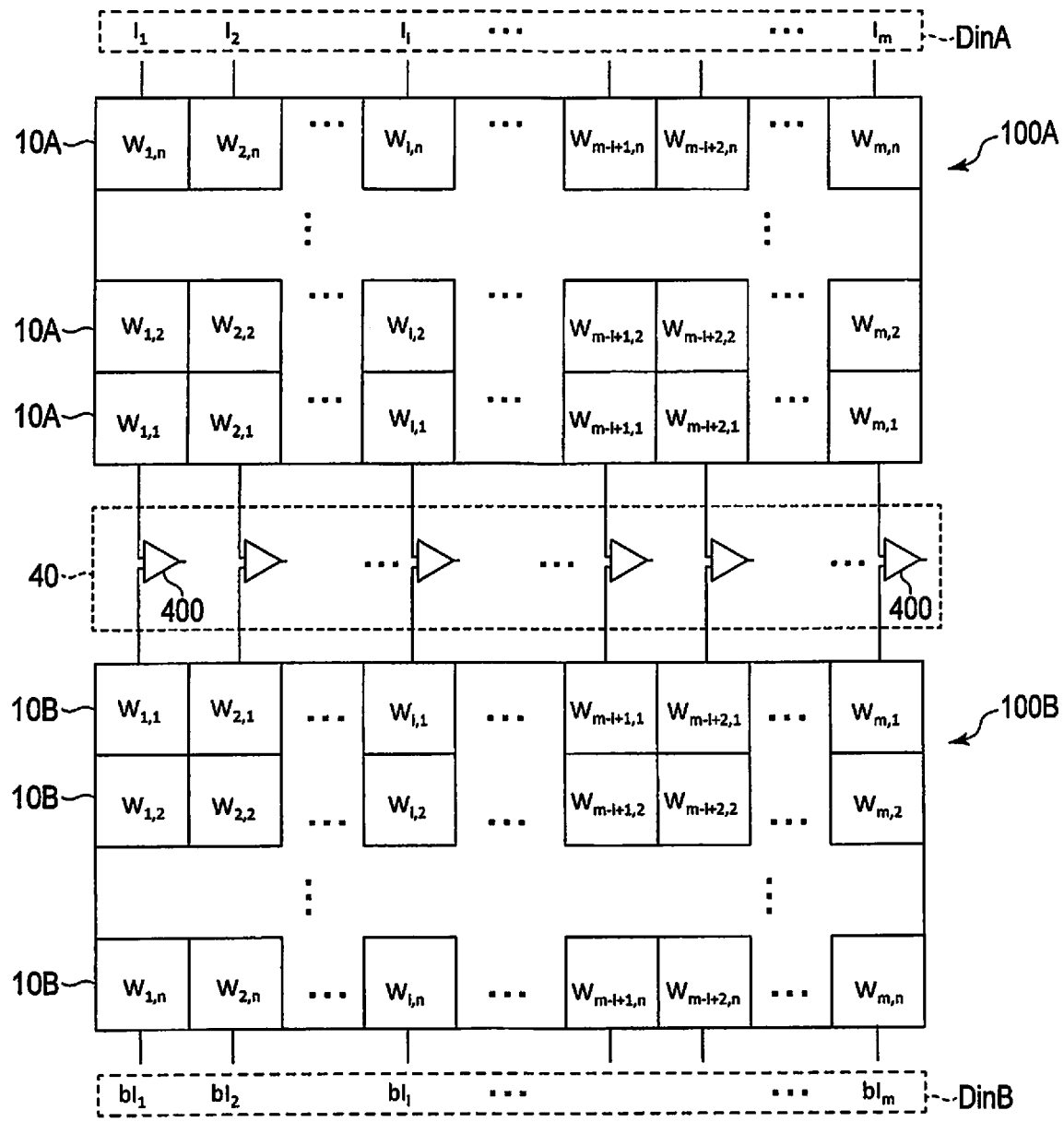

As illustrated in FIG. 18, data DinA is supplied to a data buffer 503A. The data buffer 503A temporarily holds the data DinA. Data DinB is supplied to a data buffer 503B. The data buffer 503B temporarily holds the data DinB. The data DinB is the inverted data of the data DinA. For example, the data DinA is supplied to the data buffer 503B via an inverter (not illustrated). With this arrangement, the data buffer 503B can hold the inverse data of the data DinA.

The data DinA is transferred from the data buffer 503A to the bit lines BLA via the bit line driver 502A and the bit line decoder 501A. More specifically, the bit line driver 502A sets the potentials of the bit lines BLA to potentials corresponding to the values (data sequences) in the data DinA, on the basis of each value (data sequence) I1, I2, . . . , Ii, . . . , Im of the data DinA.

The data DinB (the inverted data of the data DinA) is transferred from the data buffer 503B to the bit lines BLB via the bit line driver 502A and the bit line decoder 501A. More specifically, the bit line driver 502B sets the potentials of the bit lines BLB to potentials corresponding to the values (data sequences) in the data DinB, on the basis of each value (data sequence) bI1, bI2, . . . , bIi, . . . , bIm of the data DinB.

Figure 19:
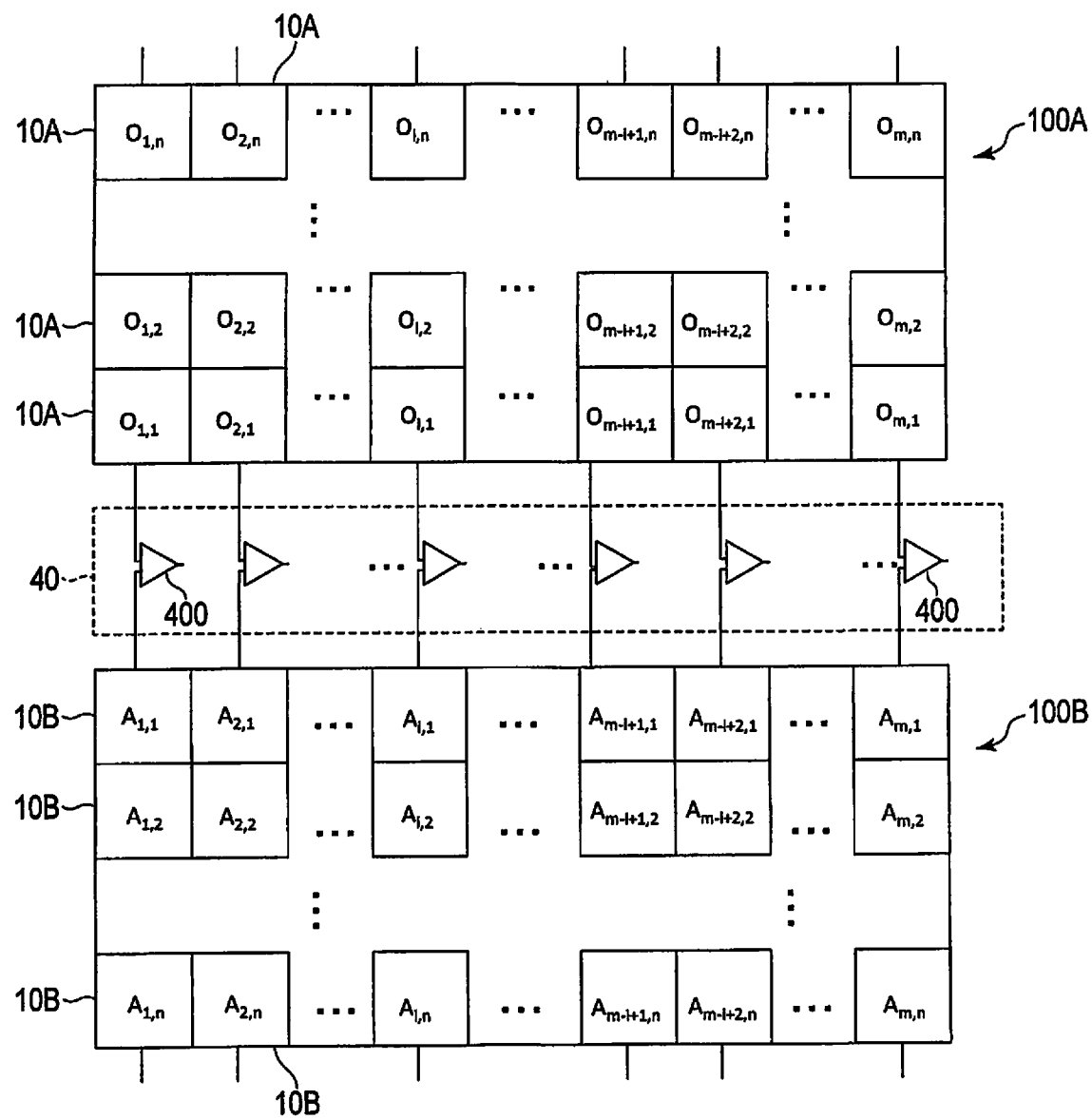

As illustrated in FIG. 19, in each of the computational circuits 100A and 100B, computational processing (write operations) is executed. By controlling the potentials of the word lines WLA and WLB, one or more strings STRA and STRB are selected.

In the OR operation circuit 100A, a "1" data write operation is executed on the selected string(s) STRA. The AP write current Iap is supplied to the conducting layer 20A to flow from the terminal T3A side to the terminal T2A side of the conducting layer 20A.

With this arrangement, in each MTJ element 21A of the string(s) STRA, an OR operation on the weight data $W_{m,n}$ and the input data DinA is executed. In each computational element 10A of the string(s) STRA of the computational circuit 100A, a result $O_{m,n}$ of the OR operation is held.

In the AND operation circuit 100B, a "0" data write operation is executed on the selected string(s) STRB. The P write current Ip is supplied to the conducting layer 20B to flow from the terminal T2B side to the terminal T3B side of the conducting layer 20B.

With this arrangement, in each MTJ element 21B of the string(s) STRB, an AND operation on the weight data $W_{m,n}$ and the data (inverted data of the data DinA) DinB is executed. In each computational element 10B of the string(s) STRB of the computational circuit 100B, a result $A_{m,n}$ of the AND operation is held.

Figure 20:
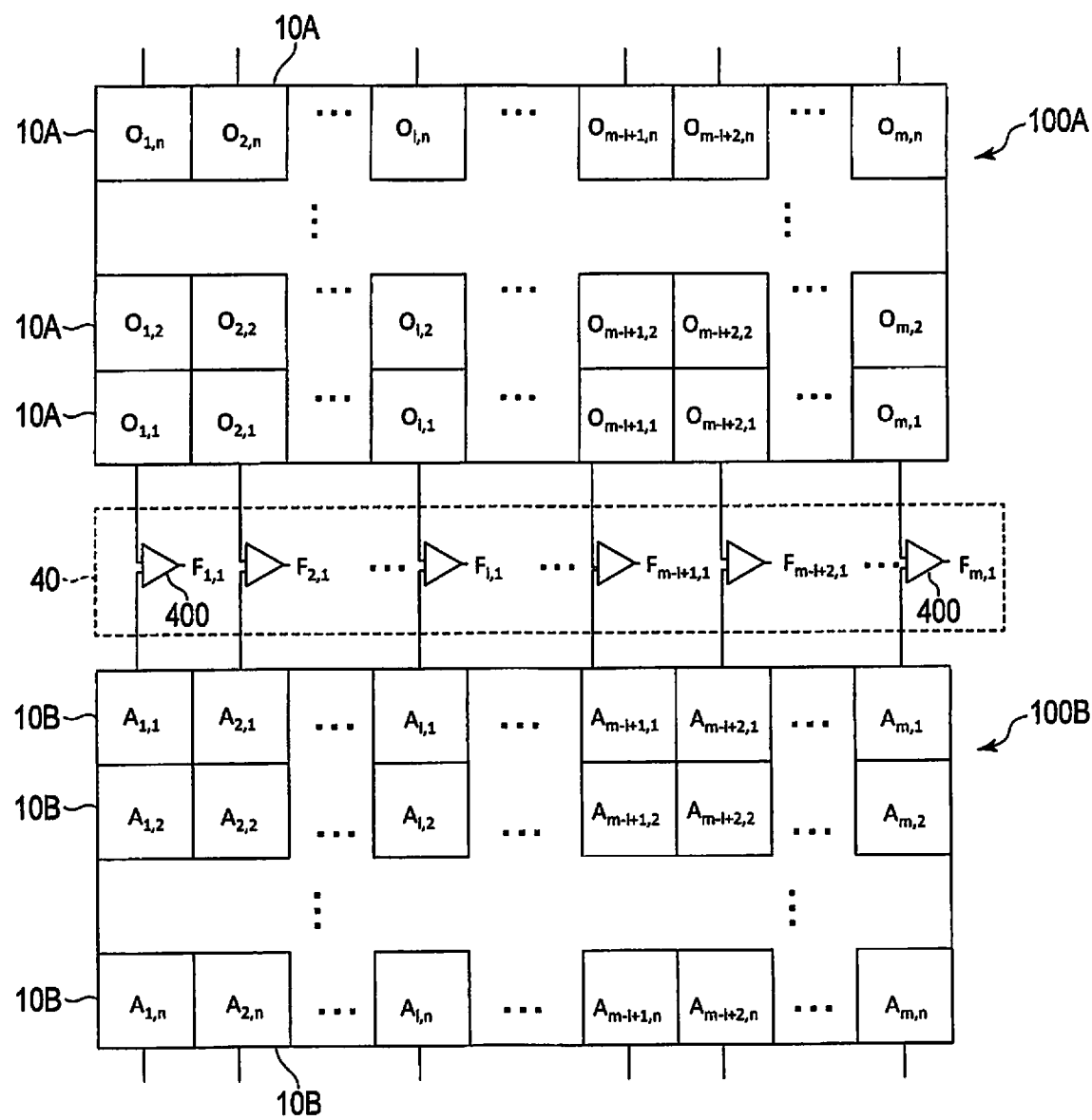

As illustrated in FIG. 20, the computational circuit 40 executes a process of comparing the data inside the OR operation circuit 100A (the OR operation results $O_{m,n}$) to the data inside the AND operation circuit 100B (the AND operation results $A_{m,n}$).

As described above, on the basis of the results of the reading of data by the sense amplifiers 400 of the computational circuit 40, a value equivalent to the result of an XNOR operation on the weight data $W_{m,n}$ and the input data Din is obtained.

In the OR operation circuit 100A, a signal corresponding to the data (resistance state) in the MTJ elements 21A is output to the bit lines BLA. In the AND operation circuit 100B, a signal corresponding to the data (resistance state) in the MTJ elements 21B is output to the bit lines BLB. The signals are respectively supplied to the input terminals of the corresponding sense amplifier 400.

Like FIGS. 14 and 15 described earlier, through the comparison of the signals by the sense amplifiers 400, the comparison results of the sense amplifiers 400 are output as a "0" or "1" output signal $F_{m,n}$. The output signal $F_{m,n}$ of the sense amplifiers 400 corresponds to an XNOR operation on the input data and the weight data.

In this way, the result of a product operation on the input data Din and the weight data W is obtained by the arithmetic logic device 1 according to the present embodiment.

<Setting Computational Processing Based on Information about Write Conditions>

Figure 21:
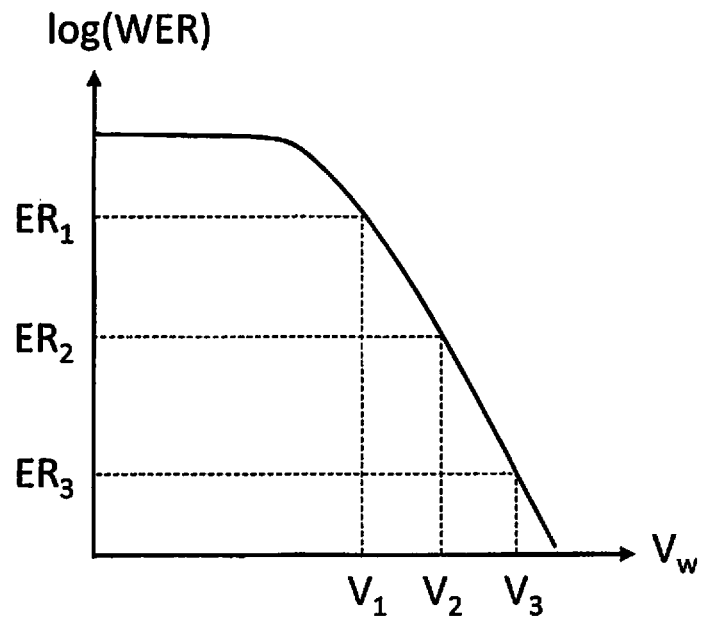

FIG. 21 is a graph illustrating the relationship between operating voltage and write error in the arithmetic logic device according to the present embodiment.

In FIG. 21, the horizontal axis of the graph corresponds to the operating voltage $V_w$, while the vertical axis of the graph corresponds to the write error. The voltage $V_w$ is a voltage (voltage value) for generating the write current Iwr. For example, the voltage $V_w$ is used as the power supply voltage of the source circuit of the driver 502. In FIG. 21, the time of a write operation (the pulse width of the write current) is set to a constant. The write voltage $V_w$ is set in a voltage range lower than the breakdown voltage of the MTJ elements. The write error is expressed as an incidence rate of write error with respect to data writes (hereinafter referred to as the write error rate).

As the voltage value of the write voltage $V_w$ increases, the current value of the write current Iwr (Iap, Ip) increases.

As illustrated in FIG. 21, the write error rate WER decreases exponentially with increases in the voltage value of the write voltage $V_w$.

Herein, the write error ratio (WER) tolerated by the computer system is different depending on the configuration of the neural network in which the arithmetic logic device according to the present embodiment is used.

By setting the write voltage $V_w$ according to the tolerable error rate, the write voltage $V_w$ can be decreased without degrading the computational accuracy of the neural network (for example, a deep neural network and/or a convolutional neural network).

Figure 22:
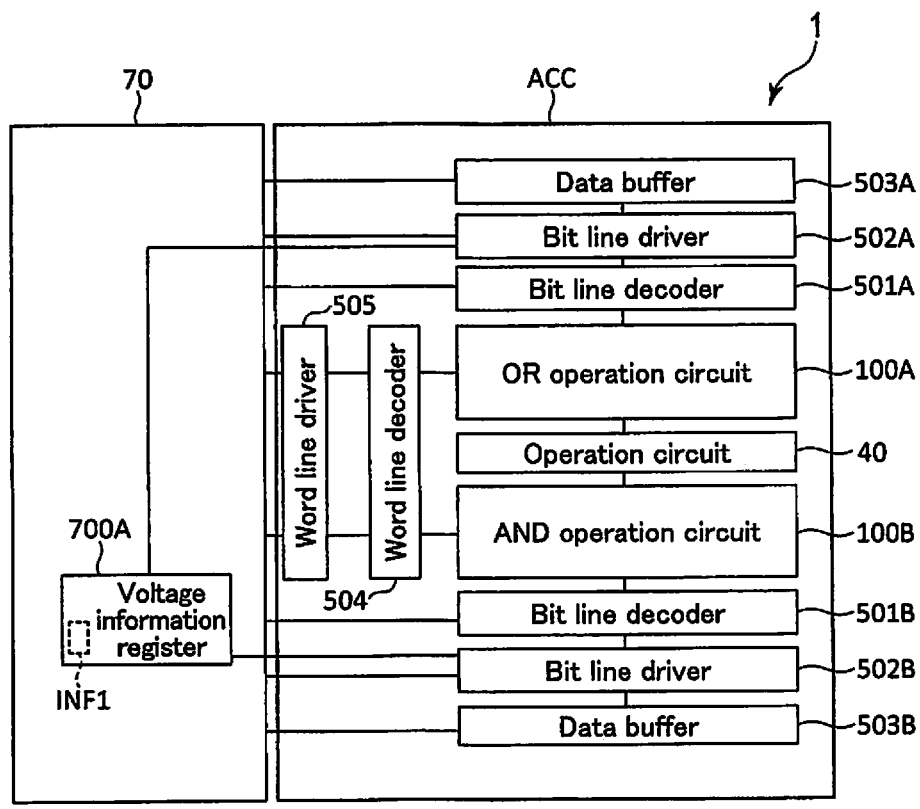
FIGS. 22 and 23 are diagrams illustrating an exemplary configuration of the arithmetic device according to the first embodiment.

FIG. 22 is a diagram illustrating a more specific example of the configuration of the arithmetic logic device according to the present embodiment.

As described earlier, the circuit (high-speed operation circuit) ACC includes the OR operation circuit 100A, the AND operation circuit 100B, and the operation circuit (read circuit) 40.

For example, the circuit ACC includes the bit line decoders 501 (501A, 501B). The bit line decoder 501A is connected to the plurality of bit lines of the OR operation circuit 100A. The bit line decoder 501A controls the activation (selected/unselected) of the plurality of bit lines of the OR operation circuit 100A. The bit line decoder 501B is connected to the plurality of bit lines of the AND operation circuit 100B. The bit line decoder 501B controls the activation (selected/unselected) of the plurality of bit lines of the AND operation circuit 100B.

For example, the circuit ACC includes the bit line drivers 502 (502A, 502B). The bit line driver 502A is connected to the plurality of bit lines BLA inside the OR operation circuit 100A via the bit line decoder 501A. The bit line driver 502A controls the potential of the plurality of bit lines BLA inside the OR operation circuit 100A. The bit line driver 502B is connected to the plurality of bit lines BLB inside the AND operation circuit 100B via the bit line decoder 501B. The bit line driver 502B controls the potential of the plurality of bit lines BLB inside the AND operation circuit 100B.

For example, the circuit ACC includes the data buffers 503 (503A, 503B).

The data buffer 503A temporarily holds data (write data) to be transferred to the OR operation circuit 100A. The bit line driver 502A controls the potential of the bit lines BLA on the basis of the data inside the data buffer 503A. The data buffer 503B temporarily holds data (write data) to be transferred to the AND operation circuit 100B. The bit line driver 502B controls the potential of the bit lines BLB on the basis of the data inside the data buffer 503B.

For example, the circuit ACC includes the word line decoder 504.

The word line decoder 504 is connected to the word lines WLA of the OR operation circuit 100A and the word lines WLB of the AND operation circuit 100B. The word line decoder 504 controls the activation (selected/unselected) of the word lines WLA of the OR operation circuit 100A and the word lines WLB of the AND operation circuit 100B.

For example, the circuit ACC includes the word line driver 505.

The word line driver 505 is connected to the word lines WLA of the OR operation circuit 100A and the word lines WLB of the AND operation circuit 100B via the word line decoder 504. The word line driver 505 controls the potential of the word lines WLA of the OR operation circuit 100A and potential of the word lines WLB of the AND operation circuit 100B.

In the arithmetic logic device 1 according to the present embodiment, the control circuit 70 holds information INF1 related to various setting conditions used in data writing (magnetization switching of the storage layer).

The control circuit 70 includes a storage area (for example, a register) 700A for storing the information INF1.

In the present embodiment, the register 700A holds information (hereinafter referred to as voltage information) INF1 related to the voltage (write voltage) $V_w$, used to generate the write current.

The voltage information INF1 is information based on the relationship between the voltage value of the write voltage $V_w$ and the write error rate. For example, the voltage information INF1 is supplied from outside the arithmetic logic device 1. For example, an external device such as a controller, a host device, or a device operated by a user supplies the voltage information INF1 to the arithmetic logic device 1. Note that instead of the write error rate, the information INF1 may be created on the basis of the number of write errors (hereinafter referred to as the write error count) under certain write conditions. Also, the write error is not limited to the write error rate and the write error count, and it is sufficient for the write error to be an error-related value that is obtainable from certain write conditions.

The register (hereinafter also referred to as the voltage information register) 700A is connected to the bit line drivers 502 (502A, 502B). The register 700A can provide the information INF1 related to the voltage value of the write voltage to the bit line drivers 502.

The bit line drivers 502 operate on the basis of the voltage information INF1 inside the register 700A.

Note that the information INF for controlling write operations with respect to the magnetoresistive effect elements 21 may be conditions and information corresponding to one of the two computational circuits 100, or conditions and information corresponding to the both of the two computational circuits 100.

Figure 23:
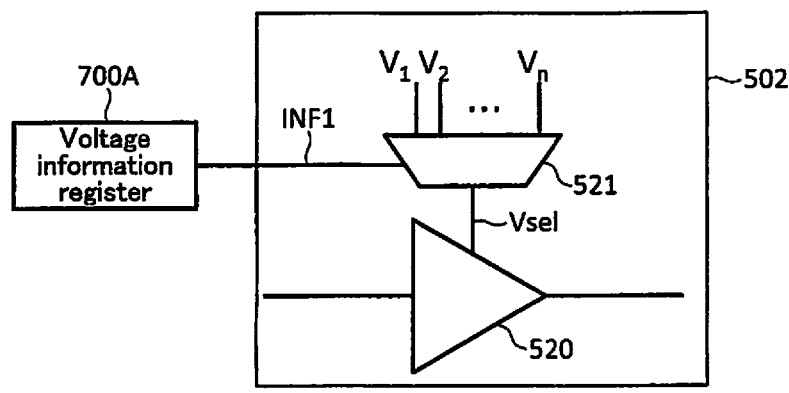

FIG. 23 is a diagram illustrating one example of the internal configuration of a bit line driver in the arithmetic logic device according to the present embodiment.

As illustrated in FIG. 23, in the arithmetic logic device according to the present embodiment, each bit line driver 502 (502A, 502B) includes a driver 520 and a selector 521.

Voltage information INF1 based on the tolerated write error rate is supplied to the selector 521. A plurality of voltage values $V_1, V_2, \ldots, V_n$ are supplied to the selector 521.

On the basis of the voltage information INF1, the selector 521 selects a voltage value from among the plurality of voltage values $V_1, V_2, \ldots, V_n$.

The selector 521 supplies the selected voltage value Vsel to the driver 520.

The driver 520 operates according to the supplied voltage value Vsel. The driver 520 outputs the write voltage $V_w$, corresponding to the voltage value Vsel.

With this arrangement, a write voltage $V_w$, in accordance with the voltage information INF1 is applied to the source side terminal of the conducting layer 20. The potential difference between the write voltage $V_w$ and the ground voltage Vss generates the write current Iwr in the conducting layer 20.

The generated write current Iwr is used to execute the computational processing in FIGS. 16 to 20 described above.

In this way, in the arithmetic logic device according to the present embodiment, voltage and current setting conditions are selected on the basis of information related to the write error (write error rate) inside a tolerable range of the computer system.

(1f) Summary

The arithmetic device (for example, the arithmetic logic device) according to the present embodiment includes a register that holds information related to data write conditions of the magnetoresistive effect elements inside the computational circuits (conditions on the computational processing by the computational elements).

The tolerated write error rate is different depending on the computational model (for example, a convolutional neural network) executed using the arithmetic device.

For example, in the case of executing computational processing for a computational model that tolerates a high write error rate, computational processing (write operations) by the arithmetic device according to the present embodiment is executable using a relatively low write voltage and write current.

On the basis of the information in the register, the arithmetic device according to the present embodiment can control the magnitude of the voltage/current used in write operations (computational processing) within the tolerable range of the write error (for example, the write error rate or the write error count) in the executed computational model.

As a result, the arithmetic device according to the present embodiment can reduce power consumption.

As above, the properties of the arithmetic device according to the first embodiment can be improved.

(2) Second Embodiment

Figure 24:
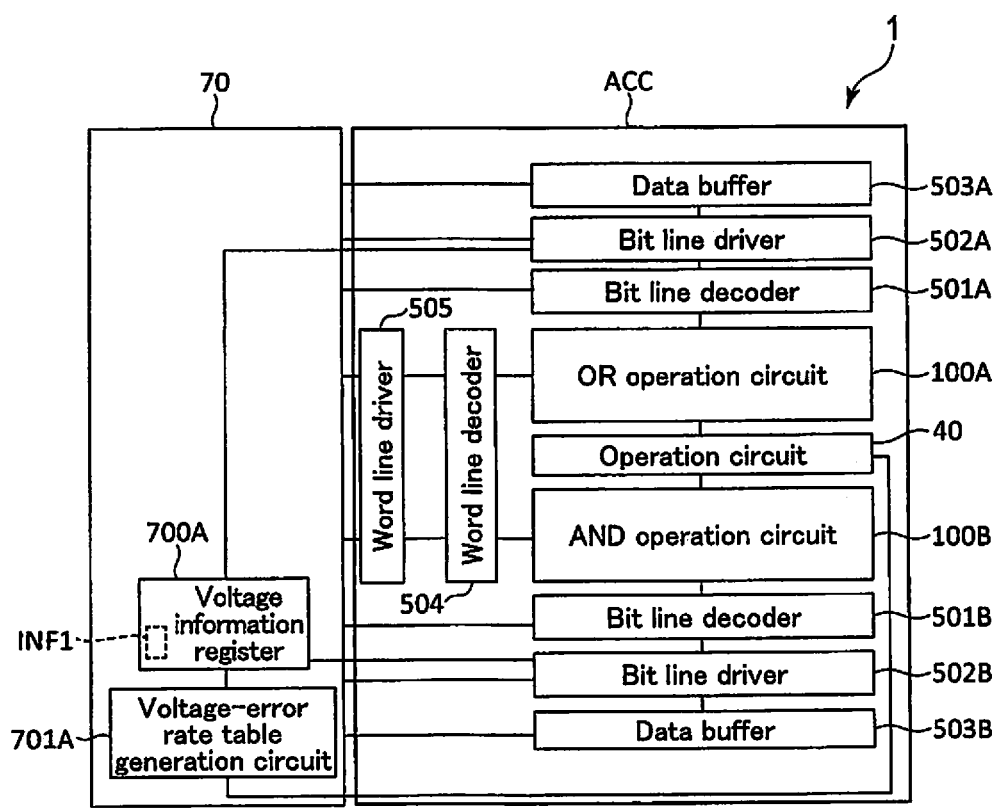

FIGS. 24 to 25 will be referenced to describe an arithmetic device and a control method for the same according to the second embodiment.

FIG. 24 is a diagram illustrating an exemplary configuration of the arithmetic device according to the present embodiment.

As illustrated in FIG. 24, the arithmetic device (for example, an arithmetic logic device) 1 according to the present embodiment includes a table generation circuit (also referred to as a test circuit) 701A inside the control circuit 70.

The table generation circuit 701A generates a table indicating the relationship between the write voltage ($V_w$) and the write error rate (WER). In the following, the circuit 701A is also referred to as the voltage-error rate table generation circuit 701A.

For example, the table generation circuit 701A is connected to the voltage information register 700A and the read circuit (operation circuit) 40.

In a test step or a BIST step, the table generation circuit 701A can execute tests on the MTJ elements 21 in the OR operation circuit 100A and the AND operation circuit 100B. The table generation circuit 701A uses the results of the tests to generate the table related to the write voltage and the write error rate. Also, the table generation circuit 701A can generate the table related to the write voltage and the write error rate by using the results of write operations and read operations during OR operations/AND operations.

Note that the table generation circuit 701A may be provided externally to the control circuit 70. The table generation circuit 701A may be provided inside the high-speed operation circuit ACC.

FIG. 25 is a diagram illustrating one example of the internal configuration of the control circuit in the arithmetic logic device according to the present embodiment.

In FIG. 25, an example of a configuration of the voltage-error rate table generation circuit 701A in the control circuit 70 is illustrated.

As illustrated in FIG. 25, the table generation circuit 701A includes an error counter control circuit 710, an error counter 711, a table holding circuit 712, a target error rate register 713, and a select circuit 714.

The error counter control circuit 710 controls the operations of the error counter 711 and the operation circuit (read circuit) 40.

The error counter 711 counts the number of write errors at the set voltage value. The error counter 711 stores a relationship between set voltage values $V_1, V_2, \ldots, V_n$ and write error rates (error counts) $ER_1, ER_2, \ldots, ER_n$ in the table holding circuit 712.

The table holding circuit 712 holds a relationship between the plurality of voltage values $V_1, V_2, \ldots, V_n$ and the write error counts $ER_1, ER_2, \ldots, ER_n$ corresponding to each of the voltage values. With this arrangement, a voltage-error rate table TBLA is generated. Also, the write error rate is computed on the basis of the number of write errors.

The target error rate register 713 holds a target value of the error rate set according to the computational model (for example, a convolutional neural network) applied in the computer system. For example, the target value of the error rate is provided by a device (or a user) external to the arithmetic logic device.

The select circuit 714 selects one value from among the plurality of voltage values $V_1, V_2, \ldots, V_n$ in the table TBLA on the basis of the target value of the error rate and the error rates $ER_1, ER_2, \ldots, ER_n$ in the table TBLA. For example, the select circuit 714 compares the table TBLA to the target value. The select circuit 714 selects the information of the voltage value corresponding to the error rate that is closest to the target value from among one or more voltage values that achieve an error rate equal to or less than the demanded error rate.

The select circuit 714 outputs the information of the selected voltage value to the voltage information register 700A. The information of the selected voltage value is stored in the voltage information register 700A.

In the arithmetic logic device according to the present embodiment, a table related to the write voltage and the write error (for example, the write error rate) is generated by the following operations.

In the case of evaluating the write error rate of the MTJ elements, writing of data and reading of data are executed on the MTJ elements 21 in the operation circuits 100. For example, in the following, an operation that includes writing of data and reading of data when evaluating the write error rate (counting the write error count) is referred to as a test operation.

A voltage value selected from among the plurality of usable voltage values is used to execute writing of data on the MTJ elements 21. Reading of data is then executed on the MTJ elements 21 to which data has been written.

In the case where the error counter control circuit 710 evaluates the error rate of the MTJ elements inside the AND operation circuit, the error counter control circuit 710 uses the MTJ elements inside the OR operation circuit as a reference resistance. In this way, the arithmetic logic device according to the present embodiment can use the read circuit (operation circuit) to evaluate the write error rate of the MTJ elements inside the AND operation circuit and the write error rate of the MTJ elements inside the OR operation circuit. Consequently, in the arithmetic logic device according to the present embodiment, increases in circuit area can be suppressed.

For example, in the case where the resistance element RX is connected to the sense amplifiers 400 of the operation circuit 40 to offset the distribution of the resistance values of the MTJ elements (see FIGS. 14 and 15), the resistance values of the MTJ elements 21A in the AP state in the OR operation circuit 100A are values between the resistance values of the MTJ elements 21B in the AP state and the resistance values of the MTJ elements 21B in the P state in the AND operation circuit 100B.

Consequently, the resistance values of the MTJ elements 21A in the AP state in the OR operation circuit 100A can be used as reference resistance values for distinguishing between the resistance values of the MTJ elements 21B in the AP state and the resistance values of the MTJ elements 21B in the P state in the AND operation circuit 100B.

Similarly, when evaluating the write error rate inside the OR operation circuit 100A, the resistance values of the MTJ elements 21B in the AP state in the AND operation circuit 100B can be used to distinguish between the resistance values of the MTJ elements 21A in the AP state and the resistance values of the MTJ elements 21A in the P state in the OR operation circuit 100A.

Writing of data and reading of data are executed for each voltage value selected from among the plurality of voltage values. With this arrangement, a write error count is obtained for each voltage value. As a result, a table related to the voltage value and the write error count is generated.

Note that the table TBLA may be created in a testing step when manufacturing the arithmetic logic device (or computer system), or may be newly created when executing computational processing (for example, computational processing using a convolutional neural network).

In the case where the table TBLA is created in the testing step, it is desirable for the table TBLA to be recorded using a one-time-programmable device, like a fuse element. In the case where the table TBLA is created when executing computational processing, the table TBLA may be recorded in non-volatile embedded memory, or may be recorded in volatile memory such as SRAM and/or DRAM.

Note that because the control of write operations using the information inside the voltage information register 700A according to the present embodiment is similar to the example of the first embodiment, a description is omitted here.

As above, the arithmetic device according to the present embodiment can decrease the current value of the write current according to a tolerable range of the write error rate on the basis of a table generated by the arithmetic device. As a result, the arithmetic device according to the present embodiment can reduce power consumption.

Consequently, the properties of the arithmetic device according to the second embodiment can be improved.

(3) Third Embodiment

Figure 26:
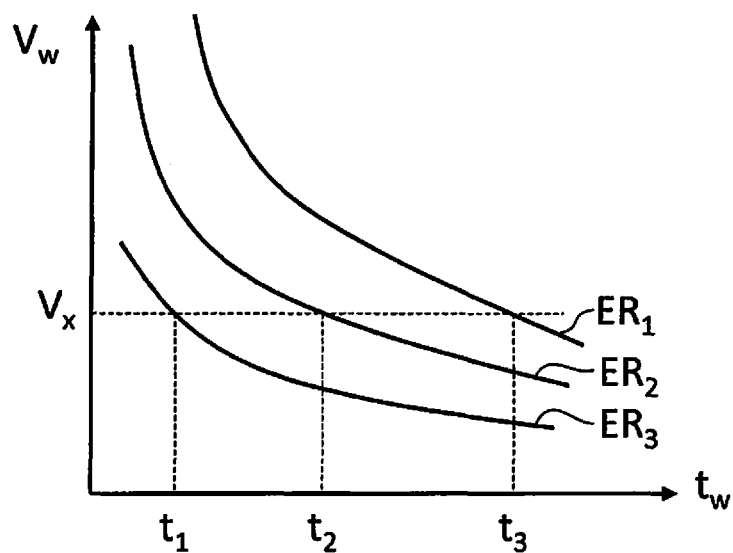
FIGS. 26, 27, and 28 are diagrams illustrating an exemplary configuration of an arithmetic device according to a third embodiment.
Figure 27:
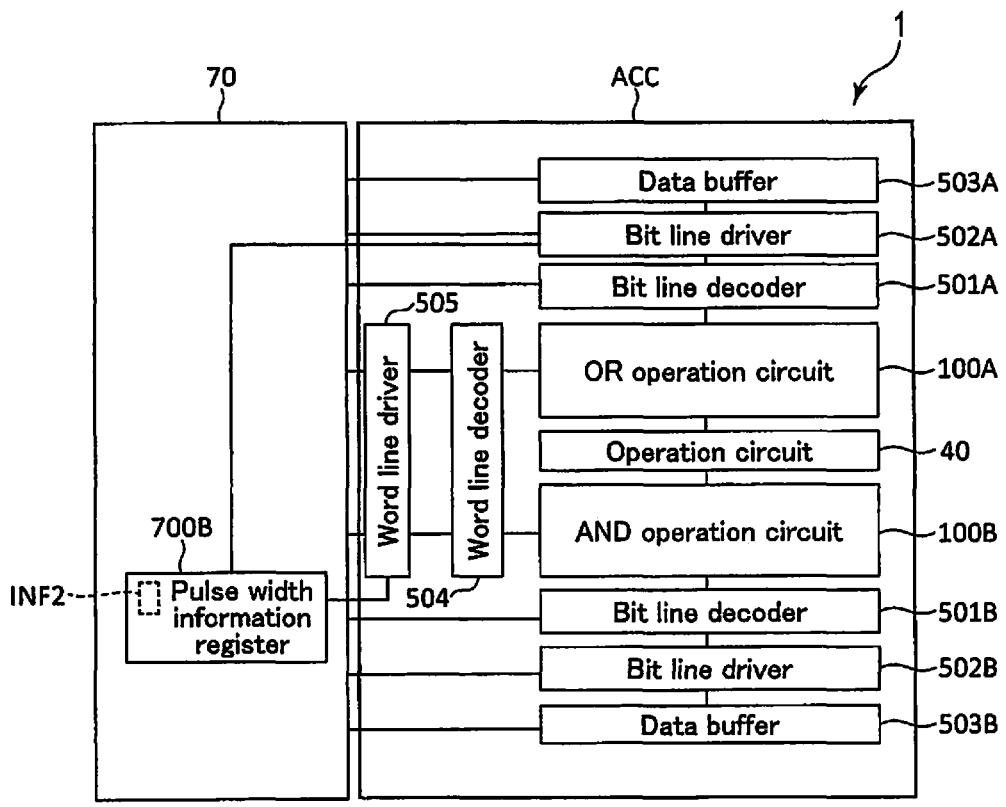
Figure 28:
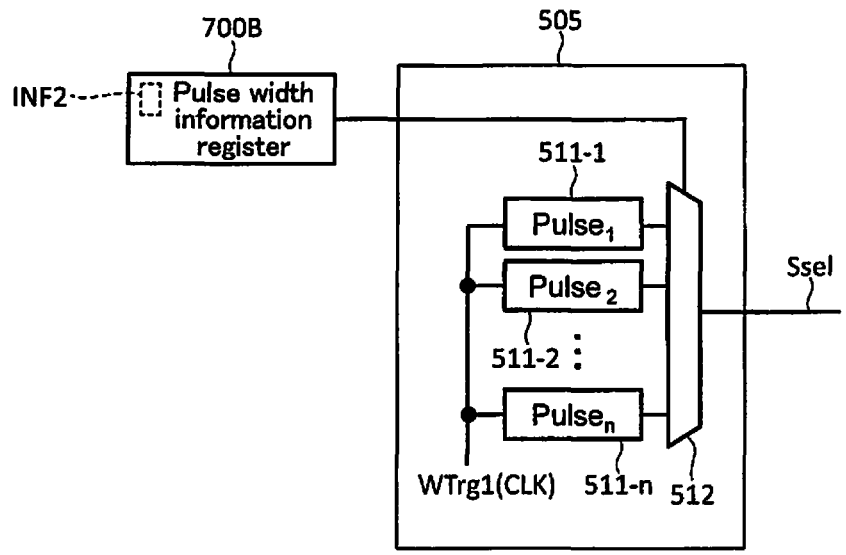

FIGS. 26 to 28 will be referenced to describe an arithmetic device according to the third embodiment.

FIG. 26 is a graph illustrating the relationship between operating voltage and write error rate in the arithmetic device according to the present embodiment.

In FIG. 26, the horizontal axis of the graph corresponds to the pulse width $t_w$ of the write voltage $V_w$, while the vertical axis of the graph corresponds to the voltage value of the write voltage $V_w$. The relationship between the pulse width $t_w$ and the voltage value $V_w$ is illustrated for each of a plurality of error rates.

The pulse width $t_w$ of the write voltage $V_w$ substantially corresponds to the period of supplying the current to the conducting layer 20.

In FIG. 26, the relationship between the pulse width $t_w$ and the voltage value $V_w$ for the three error rates $ER_1$, $ER_2$, and $ER_3$ is illustrated. The three write error rates $ER_1$, $ER_2$, and $ER_3$ have relative magnitudes such that $ER_1<ER_2<ER_3$.

Herein, for each write error rate, if the pulse width of the write voltage is decreased (if the write voltage application time is shortened), the voltage value of the write voltage $V_w$ rises.

In the case where the voltage value of the write voltage $V_w$ is the same (for example, a voltage value $V_x$), if the pulse width of the write voltage is increased (if the write voltage application time is lengthened), the error rate falls.

On the basis of this relationship between the error rate and the pulse width, for a write voltage $V_w$ of a certain voltage value, a more suitable pulse width (write time) of the write voltage may be selected according to the error rate demanded by the computer system.

As below, by controlling the pulse width of the write voltage (write current), the arithmetic device (for example, an arithmetic logic device) according to the present embodiment can reduce power consumption.

FIG. 27 is a diagram illustrating an exemplary configuration of the arithmetic logic device according to the present embodiment.

As illustrated in FIG. 27, in the arithmetic logic device 1 according to the present embodiment, the control circuit 70 includes a register 700B.

In the present embodiment, the register 700B holds information (hereinafter also referred to as pulse width information) INF2 about the pulse width of the write voltage. In the following, the register 700B is also referred to as the pulse width information register.

The pulse width information INF2 is information based on the relationship between the voltage value and the pulse width $t_w$ of the write voltage $V_w$ for each error rate. For example, the pulse width information INF2 is supplied to the arithmetic logic device 1 by user input from an external device, such as a controller or a host device. Note that the pulse width information INF2 may be created using the write error count instead of the write error rate.

The pulse width information register 700B is connected to the word line driver 505, for example. The pulse width information register 700B provides information related to the pulse width of the write voltage to the word line driver 505.

The word line driver 505 operates on the basis of the information INF2 in the pulse width information register 700B. The word line driver 505 activates the word line WL connected to each selected string STR for a period corresponding to the pulse width of the write voltage $V_w$.

With this arrangement, in the arithmetic logic device 1 according to the present embodiment, the pulse width of the write voltage (write current) supplied to the computational elements 10 is controlled.

FIG. 28 is a diagram illustrating one example of the configuration of a word line driver in the arithmetic logic device according to the present embodiment.

As illustrated in FIG. 28, the word line driver 505 includes a plurality of pulse generators 511 (511-1, 511-2, ..., 511-n) and a selector 512.

The plurality of pulse generators 511 respectively generate signals with mutually different pulse widths. A trigger signal WTrg1 is supplied to each pulse generator 511. The trigger signal WTrg1 is a clock signal CLK on a certain cycle (frequency), for example. Each pulse generator 511 can use the trigger signal WTrg1 to control the pulse width. With this arrangement, the pulse generators 511 respectively output signals with mutually different pulse widths.

The plurality of pulse generators 511 supply the generated write voltages $V_W$ to the selector 512.

The selector 512 receives the pulse width information INF2 from the pulse width information register 700B. The selector 512 receives the outputs from the plurality of pulse generators 511. The selector 512 selects one of the outputs from among the plurality of pulse generators 511, on the basis of the pulse width information INF2. The selector 512 outputs a selected signal Ssel to the word line decoder 504.

The selected signal Ssel is supplied to the gates of the transistors TR2 and TR3 via the word line decoder 504 and the word line(s) WL.

With this arrangement, the transistors TR2 and TR3 are set to an ON state during a period corresponding to the pulse width of the signal Ssel. As a result, during the operations in FIGS. 16 to 20 described earlier, the write voltage (write current) supply period is set according to the magnitude of the pulse width.

As above, the arithmetic device according to the present embodiment can vary the write current supply period according to a tolerable range of write error (for example, the write error rate or the write error count).

Consequently, the arithmetic device according to the present embodiment can reduce power consumption.

Consequently, the properties of the arithmetic device according to the third embodiment can be improved.

(4) Fourth Embodiment

Figure 29:
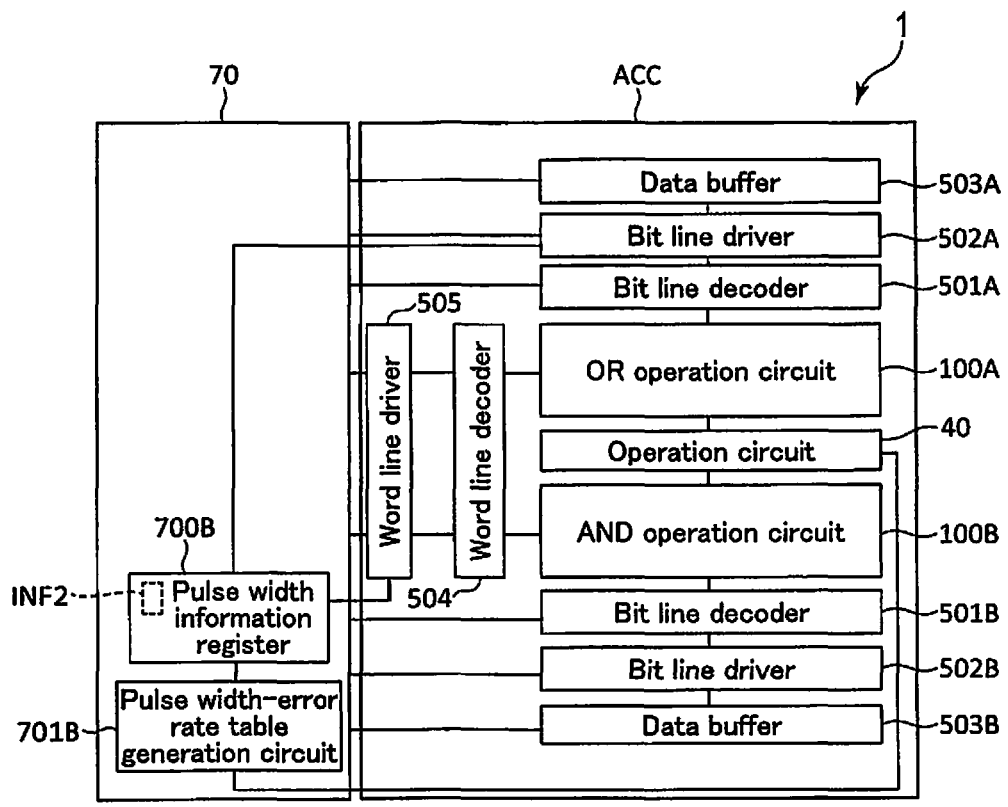
FIGS. 29 and 30 are diagrams illustrating an exemplary configuration of an arithmetic device according to a fourth embodiment.
Figure 30:
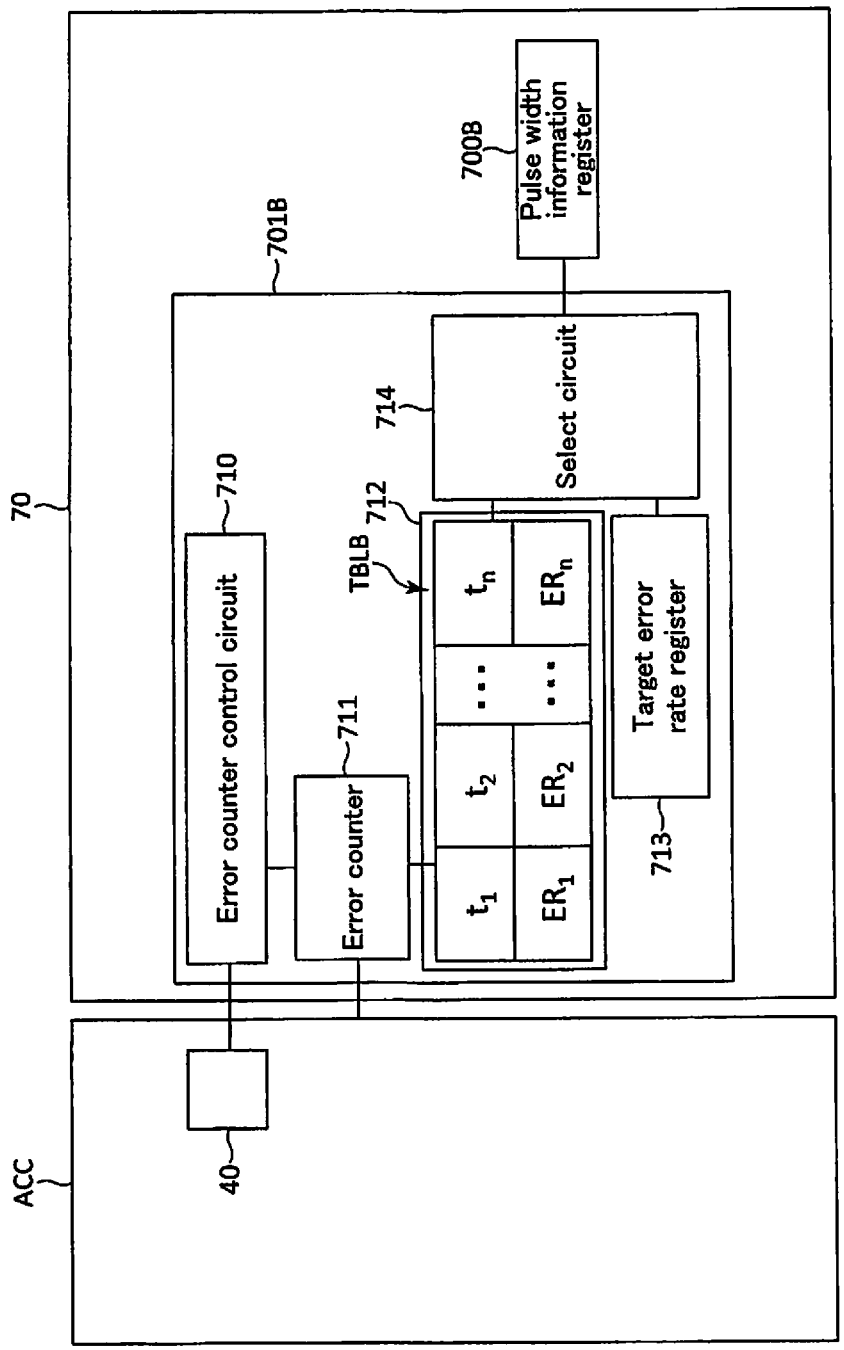

FIGS. 29 to 30 will be referenced to describe an arithmetic logic device according to the fourth embodiment.

FIG. 29 is a diagram illustrating an exemplary configuration of the arithmetic logic device according to the present embodiment.

As illustrated in FIG. 29, the arithmetic device (for example, an arithmetic logic device) 1 according to the present embodiment includes a table generation circuit 701B inside the control circuit 70.

The table generation circuit 701B generates a table indicating the relationship between a plurality of write errors (for example, write error rates) and the pulse width. In the following the circuit 701B is also referred to as the pulse width-error rate table generation circuit 701B.

The table generation circuit 701B is connected to the pulse width information register 700B and the operation circuit (read circuit) 40, for example.

During computational processing, in a test step, or in a BIST step, the table generation circuit 701B can execute write error tests on the MTJ elements 21 in the OR operation circuit 100A and the AND operation circuit 100B. The table generation circuit 701B uses the test results to generate a table.

FIG. 30 is a diagram illustrating one example of the internal configuration of the control circuit in the arithmetic logic device according to the present embodiment.

In FIG. 30, an example of a configuration of the pulse width-error rate table generation circuit 701B in the control circuit 70 is illustrated.

As illustrated in FIG. 30, the table generation circuit 701B includes an error counter control circuit 710, an error counter 711, a table holding circuit 712, a target error rate register 713, and a select circuit 714.

The error counter control circuit 710 controls the operations of the error counter 711 in tests related to the pulse width and the error rate. Also, the error counter control circuit 710 can control the operations of the read circuit (operation circuit) 40.

The error counter 711 counts the number of write errors for the pulse width set with respect to a certain write voltage. The write error rate is computed on the basis of the number of write errors. The error counter 711 stores the relationship between the pulse width and the write error rate in the table holding circuit 712.

The table holding circuit 712 holds values indicating the relationship between a plurality of pulse widths and a plurality of write error rates as a table. With this arrangement, a pulse width-error rate table TBLB is generated.

The target error rate register 713 holds a target value of the write error rate demanded by the computer system (convolutional neural network). For example, the target value is provided by a user.

On the basis of the target value of the write error rate and error rates $ER_1, ER_2, \ldots, ER_n$ in the table TBLB, the select circuit 714 selects a pulse width from among a plurality of pulse widths $t_1, t_2, \ldots, t_n$ in the table TBLB.

For example, on the basis of a comparison between the error rates in the table TBLB and the target value, the select circuit 714 selects the smallest pulse width from among the write pulse widths capable of achieving an error rate equal to or less than the target value. The select circuit 714 outputs information about the selected pulse width to the pulse width information register 700B. The information about the selected write pulse width is stored in the pulse width information register 700B.

During computational processing, write pulse information INF2 in the register 700B is supplied to the word line driver 505. With this arrangement, the pulse width (word line activation period) of the write current (write voltage) is set on the basis of the information INF2 in the register 700B.

Note that because the control of write operations using the information inside the voltage information register 700A according to the present embodiment is similar to the example of the first embodiment, a description is omitted here.

As above, the arithmetic device according to the fourth embodiment can reduce power consumption.

(5) Fifth Embodiment

Figure 31:
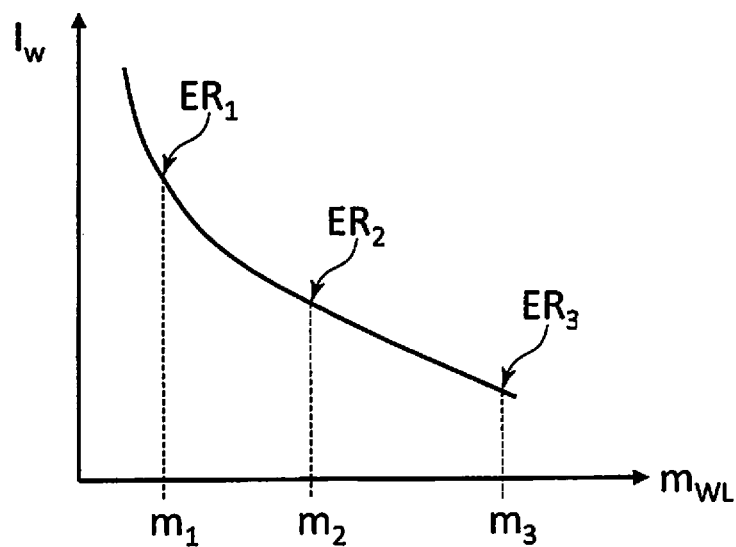
FIGS. 31, 32, and 33 are diagrams illustrating an exemplary configuration of an arithmetic device according to a fifth embodiment.
Figure 32:
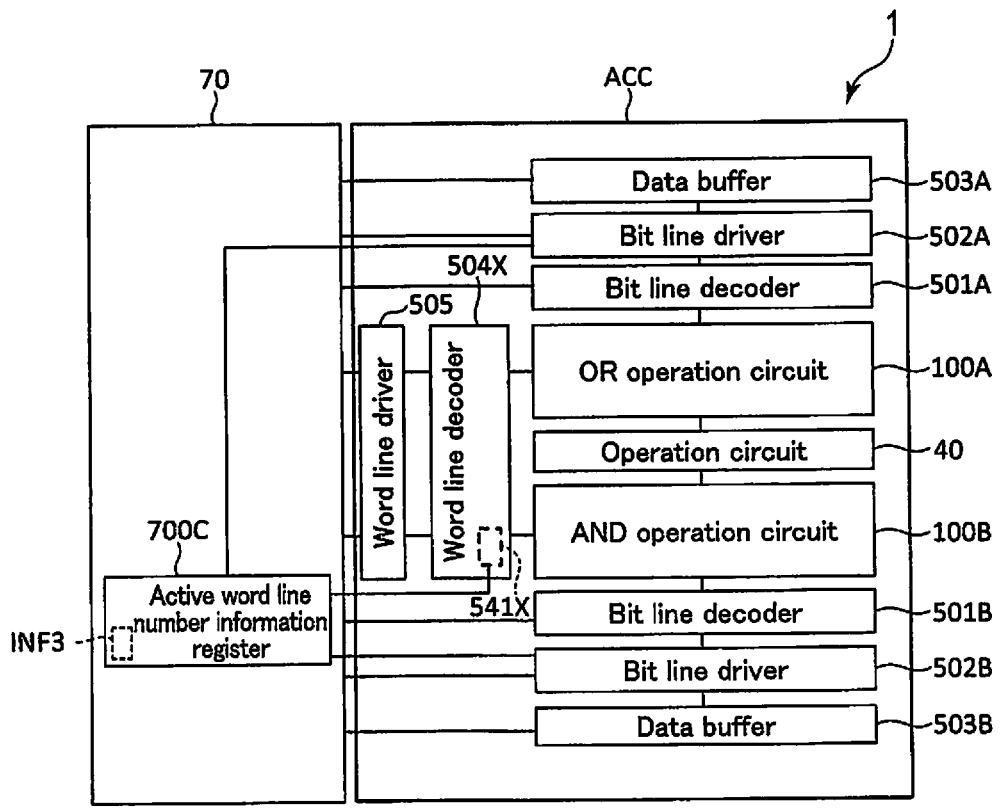
Figure 33:
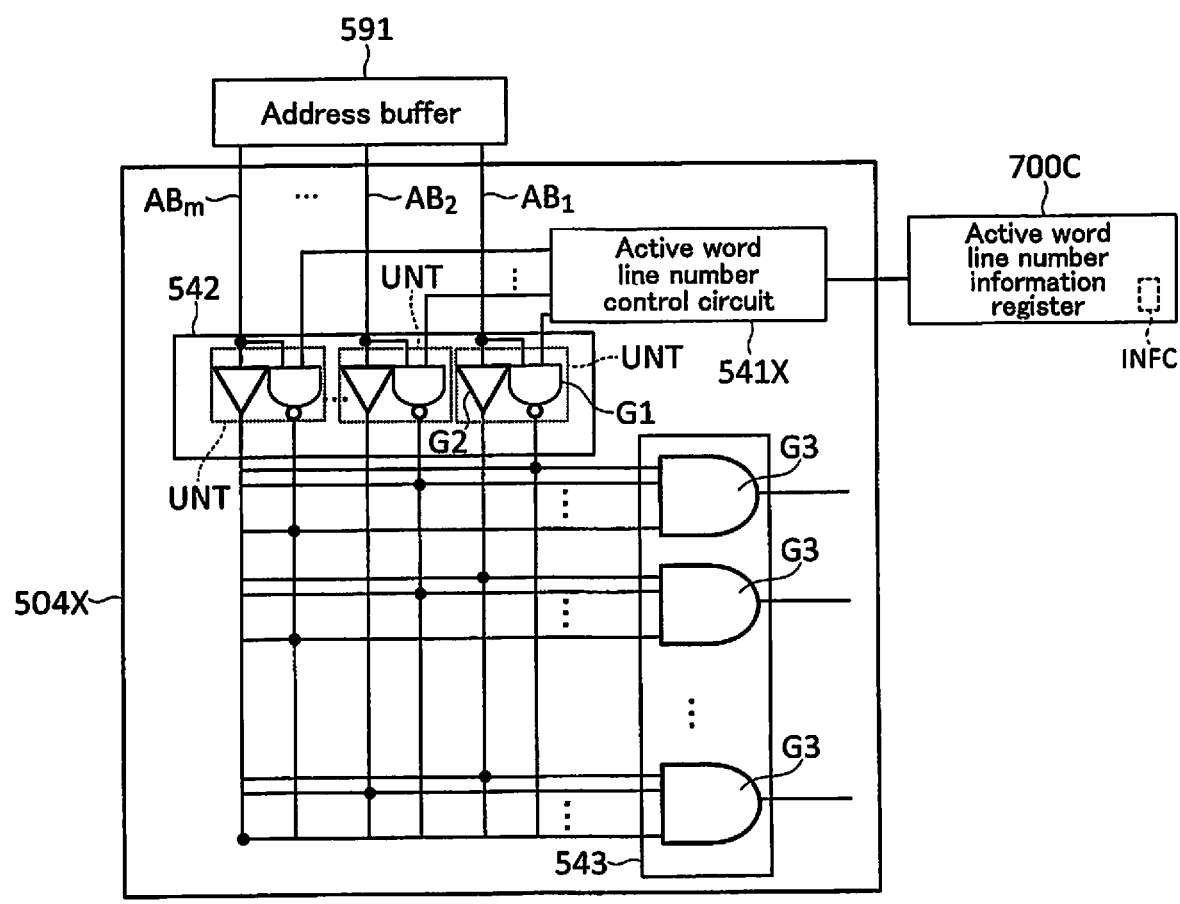

FIGS. 31 to 33 will be referenced to describe an arithmetic device according to the fifth embodiment.

FIG. 31 is a graph illustrating the relationship between current and write error in the arithmetic device according to the present embodiment.

In FIG. 31, the horizontal axis of the graph corresponds to a number $m_{WL}$ of word lines WL activated during a compute operation, while the vertical axis of the graph corresponds to the current value of the operating current $I_w$ (write current Iwr).

Regarding the numbers $m_{WL}$ of the activated word lines in FIG. 31, "$m_1$", "$m_2$", and "$m_3$" exist in a relationship where $m_1 < m_2 < m_3$.

In FIG. 31, the relationship between the number of activated word lines and the operating current for the three write error rates $ER_1$, $ER_2$, and $ER_3$ is illustrated. As described earlier, the three write error rates $ER_1$, $ER_2$, and $ER_3$ have relative magnitudes such that $ER_1 < ER_2 < ER_3$.

As illustrated in FIG. 31, as the number of activated word lines increases, the write current is distributed to a greater plurality of selected strings. For this reason, as the number of activated word lines increases, the current value of the write current supplied to each selected string becomes smaller. As a result, the write error rate tends to rise in accordance with an increase in the number of activated word lines.

In this way, in the present embodiment, by controlling the number of word lines activated at the same time, the current value of the write current can be set while considering a tolerance value of the write error (for example, the write error rate).

FIG. 32 is a diagram illustrating an exemplary configuration of the arithmetic device according to the present embodiment.

As illustrated in FIG. 32, in the arithmetic device (for example, an arithmetic logic device) 1 according to the present embodiment, the control circuit 70 includes a register 700C.

In the present embodiment, the register 700C holds information (also referred to as active word line number information) INF3 about the number of word lines activated at the same time during computational processing (a write operation). In the following, the register 700C is also referred to as the active word line number information register.

The active word line number information INF3 is information based on the relationship between each write error rate and the number of activated word lines. For example, the active word line number information INF3 is supplied to the arithmetic logic device 1 by user input from an external device, such as a controller or a host device. Note that the active word line number information INF3 may be formed using the write error count instead of the write error rate.

The active word line number information register 700C is connected to the bit line drivers 502 (502A, 502B) and a word line decoder 504X, for example.

The active word line number information register 700C provides information related to the pulse width of the write voltage to the word line decoder 504X.

The bit line driver 502 and the word line decoder 504X operates on the basis of the active word line number information INF3 in the register 700C.

For example, in the arithmetic logic device 1 according to the present embodiment, the word line decoder 504X includes a circuit 541X. The circuit 541X controls the number of word lines to be activated.

FIG. 33 is a diagram illustrating one example of the internal configuration of the control circuit in the arithmetic logic device according to the present embodiment.

As illustrated in FIG. 33, the word line decoder 504X includes an active word line number control circuit 541X, an address decode circuit 542, and a gate circuit 543.

In the word line decoder 504X, the address decode circuit 542 includes a plurality of decode units UNT. Each decode unit UNT is configured with a NAND gate G1 and a buffer G2.

The address decode circuit 542 receives an address from an address buffer 591. The value of each bit (also referred to as an address bit value) $AB_1, AB_2, \ldots, AB_m$ of an address is supplied to a corresponding decode unit UNT.

Each address bit value $AB_m$ is supplied to one of the input terminals of the NAND gate G1 and to the buffer G2. The other input terminal of each NAND gate G1 is connected to the active word line number control circuit 541X.

The gate circuit 543 includes a plurality of word line driving gates G3. The signals from the plurality of decode units UNT are respectively supplied to each word line driving gate G3. Each word line driving gate G3 activates or deactivates a corresponding word line WL on the basis of the supplied signal.

In the case where the active word line number control circuit 541X supplies an "H" level signal to the NAND gate G1, the NAND gate G1 outputs the inverted signal of the address bit $AB_1$. At this time, the NAND gate G1 and the buffer G2 operate as an inverter-buffer pair, and activate the input of the word line driving gate G3 corresponding to the address.

On the other hand, in the case where the active word line number control circuit 541X supplies an "L" level signal to the NAND gate G1 and the address bit value $AB_m$ is "H" level, the signal supplied to all of the word line driving gates G3 corresponding to the address bit value $AB_m$ goes to "H" level.

In other words, both of the output signals from the NAND gate G1 and the buffer G2 that received the address bit value $AB_m$ as input go to "H" level.

With this arrangement, the address bit value $AB_m$ is ignored in the word line driving gate G3. For this reason, the number of activated word lines becomes double the case where the address bit value $AB_m$ is valid.

In this way, in the case where there are m NAND gates G1 that output an "H" level signal, the number of activated word lines may be set to $2^m$.

With this arrangement, one or more word lines corresponding to the active word line number information INF3 are activated.

Consequently, a plurality of strings STR are set to the selected state. The write voltage (write current) is supplied to the plurality of strings STR in the selected state.

As a result, OR operations are executed in parallel on a plurality of strings STRA inside the OR operation circuit 100A. Similarly, AND operations are executed in parallel on a plurality of strings STRB inside the AND operation circuit 100B.

Consequently, the arithmetic logic device according to the present embodiment can reduce power consumption, while in addition, a speedup of computational processing can be attained.

As above, the properties of the arithmetic device according to the present embodiment can be improved.

(6) Sixth Embodiment

FIGS. 34 and 35 will be referenced to describe an arithmetic device according to the sixth embodiment.

FIG. 34 is a diagram illustrating an exemplary configuration of the arithmetic device according to the present embodiment.

As illustrated in FIG. 34, the arithmetic logic device 1 (for example, an arithmetic logic device) according to the present embodiment includes a table generation circuit 701C inside the control circuit 70.

The table generation circuit 701C generates a table indicating the relationship between the write error rate and the number of activated word lines. In the following, the circuit 701C is also referred to as the active word line number-error rate table generation circuit 701C.

The table generation circuit 701C is connected to the register 700C and the read circuit (operation circuit) 40, for example.

During computational processing, in a test step, or in a BIST step, the table generation circuit 701C can execute tests related to the relationship between the number of activated word lines and the write error (for example, the write error rate) on the MTJ elements 21 in the OR operation circuit 100A and the AND operation circuit 100B.

The table generation circuit 701C uses the test results to generate a table related to conditions on write operations.

FIG. 35 is a diagram illustrating one example of the internal configuration of the control circuit in the arithmetic logic device according to the present embodiment.

In FIG. 35, an example of a configuration of the active word line number-error rate table generation circuit 701C in the control circuit 70 is illustrated.

As illustrated in FIG. 35, the table generation circuit 701C includes an error counter control circuit 710, an error counter 711, a table holding circuit 712, a target error rate register 713, and a select circuit 714.

The error counter control circuit 710 controls the operations of the error counter 711 in tests related to the number of activated word lines and the current value of the write current.

The error counter 711 counts the number of write errors with respect to the number of activated word lines. For example, the write error rate is computed on the basis of the number of write errors.

The error counter 711 stores the relationship between the number of activated word lines and the write error rate in the table holding circuit 712.

The table holding circuit 712 holds the relationship between a plurality of numbers of activated word lines and the write error rate corresponding to each number of activated word lines as a table. With this arrangement, an active word line number-error rate table TBLC is generated.

The target error rate register 713 holds a target value of the write error rate.

The select circuit 714 selects one value from among the plurality of active word line numbers $m_1, m_2, \ldots, m_n$ in the table TBLC on the basis of the target value of the error rate and the error rates $ER_1, ER_2, \ldots, ER_n$ in the table TBLC. The select circuit 714 outputs information about the selected active word line number to the active word line number information register 700C. The information about the selected active word line number is stored in the register 700C.

Note that because the control of write operations using the information inside the active word line number information register 700C according to the present embodiment is similar to the example of the fifth embodiment, a description is omitted here.

Through a testing step (or a compute operation), the arithmetic logic device according to the present embodiment creates a table indicating the relationship between the write error rate and the number of activated word lines.

The number of word lines to be activated at the same time is controlled on the basis of the active word line number-error rate information INF3 (active word line number-error rate table TBLC) in the register 700C.

With this arrangement, the arithmetic logic device according to the present embodiment can reduce power consumption occurring during computational processing while also satisfying a tolerance value of the write error.

As above, the properties of the arithmetic device according to the present embodiment can be improved.

(7) Application Examples

Figure 36:
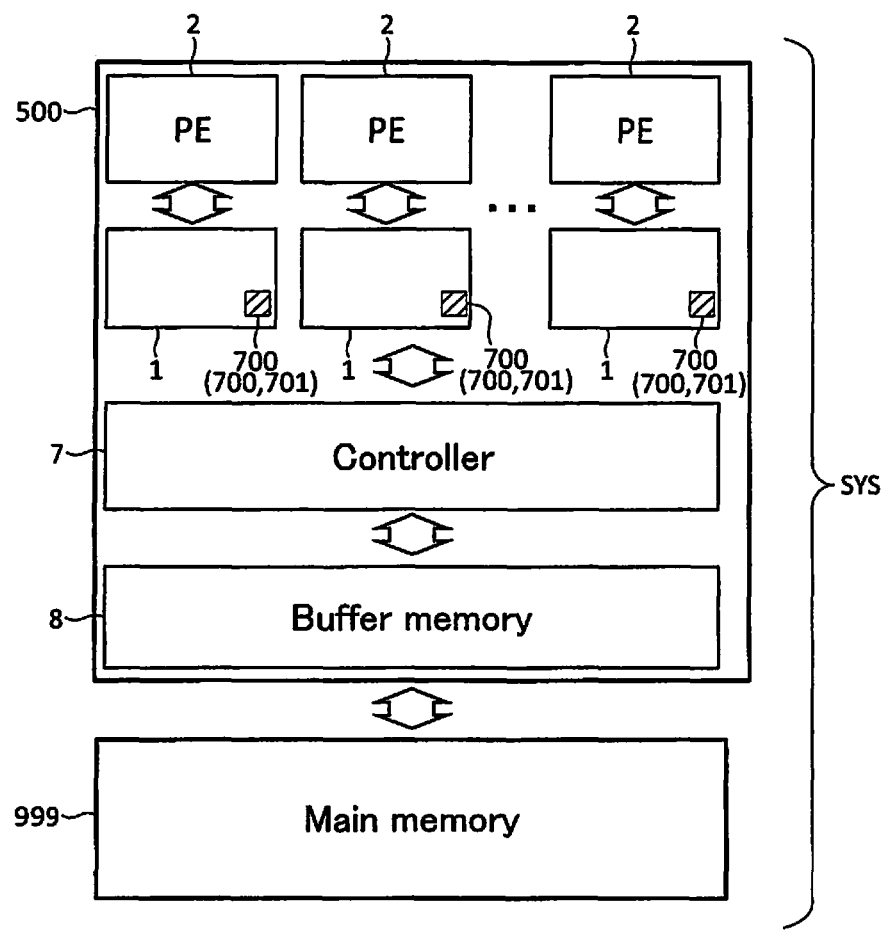
Figure 37:
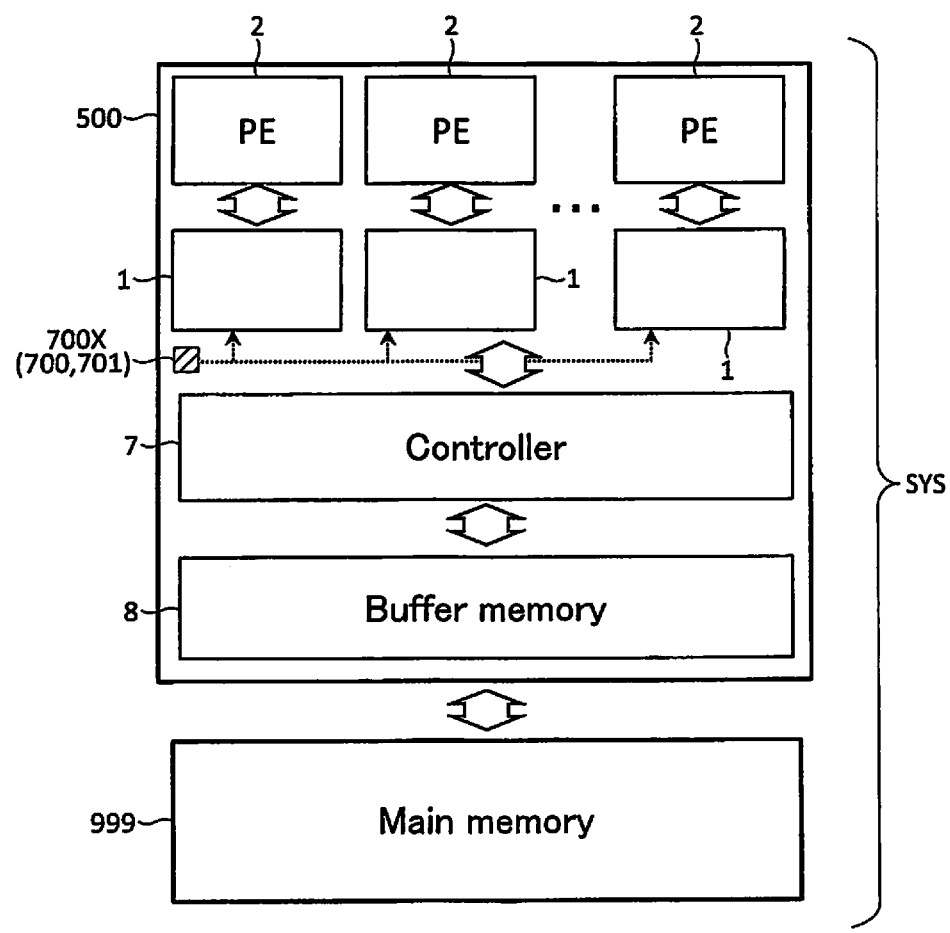

FIGS. 36 to 38 will be referenced to describe application examples of the arithmetic device according to the embodiments. The arithmetic device according to the embodiments is applied to a computer system.

(7a) Example 1

FIG. 36 will be used to describe one application example of the arithmetic device according to the embodiments.

FIG. 36 illustrates a computer system including the arithmetic device according to the embodiments in the present application example. For example, the computer system in FIG. 36 can use the arithmetic device (for example, an arithmetic logic device) according to the embodiments to execute the computational processing of a convolutional neural network based on a certain computational model.

For example, a computer system SYS is used for machine learning or deep learning processing such as image recognition.

The computer system SYS according to the present application example includes a processor 500 and main memory 999.

The processor 500 includes arithmetic logic devices 1, arithmetic logic devices 2, a controller 7, and memory 8 according to the embodiments. For example, these devices 1, 2, 7, and 8 are provided on a single chip or a single package substrate.

One or more devices selected from among the arithmetic logic devices according to the first to sixth embodiments described above are used in the computer system SYS of the present application example.

For example, in various types of computational processing by the computer system SYS, the arithmetic logic device 1 according to the embodiments can execute OR operations, AND operations, and XNOR operations (product operations) on input data and weight data.

The arithmetic logic device 1 according to the embodiments includes the register 700. One or more of the voltage information INF1, the pulse width information INF2, and the active word line number information INF3 described above are memorized in the register 700. The arithmetic logic device 1 executes write operations (computational processing) on the MTJ elements 21 under write conditions set on the basis of the information in the register 700.

For example, in addition to the register 700, the arithmetic logic device 1 may include the table generation circuits 701 (701A, 701B, 701C) according to the embodiments described above.

The arithmetic logic device 1 according to the embodiments can achieve a speedup in arithmetic processing through massively parallel processing by the plurality of strings STR inside the computational circuits 100. The arithmetic logic device 1 according to the embodiments executes product operations in the neural network, for example.

The arithmetic logic device 1 according to the embodiments may also function as a memory area (memory device).

For example, the arithmetic logic device 2 executes one or more types of processing such as sum operations in the neural network, batch normalization processing, and activation operations.

The memory (for example, buffer memory) 8 temporarily holds intermediate data obtained by computational processing. For example, one type of memory selected from among SRAM, DRAM, and magnetic memory (for example, STT-MRAM or VoCSM) is used for the buffer memory 8.

The controller (for example, a memory controller) 7 controls the operations of the arithmetic logic devices 1, 2 and the buffer memory 8. The controller 7 controls the transfer of data among the arithmetic logic devices 1, 2 and the buffer memory 8.

The main memory 999 can memorize data such as weight-related data (W), activation-related data (I), and data related to computational results (output data). The main memory 999 provides the weight-related data (W) and the activation-related data (I) to the processor 500 that includes the arithmetic logic device 1 according to the embodiments. The main memory 999 receives data (computational results) from the processor 500.

The main memory 999 is DRAM, for example.

In the computer system SYS according to the present application example, computational processing including operations such as OR operations, AND operations, and XNOR operations performed on input data and weight data is executed like in the exemplary operations of the arithmetic logic device according to the embodiments described above.

With this arrangement, the computer system SYS according to the present application example can obtain desired computational results.

The computer system SYS including the arithmetic logic device according to the embodiments executes product-sum operations processing in a neural network.

For example, the computer system SYS according to the present application example may be applied to an image recognition device that performs image processing using a convolutional neural network. For example, an image recognition device including the computer system SYS according to the present application example may be installed in an apparatus such as a digital camera, a monitoring camera, a mobile terminal, a smartphone, an in-vehicle camera, a personal computer, or a liquid crystal display.

In the computer system SYS according to the present application example, the arithmetic logic device 1 according to the embodiments holds information indicating the relationship between the write error (for example, the write error rate or the write error counter) and the write conditions in the register 700.

The computer system SYS according to the present application example can use the information in the arithmetic logic device 1 to set conditions on write operations (computational processing) with respect to the MTJ elements according to a tolerable range of write error in the neural network of a certain computational model. In the computer system SYS according to the present application example, the arithmetic logic device according to the embodiments can execute write operations (computational processing, such as OR operations and/or AND operations, for example) on the MTJ elements on top of the conducting layer, according to the set write conditions.

For example, in the computer system SYS according to the present application example, the current value of the write current with respect to the MTJ elements used in computational processing can be reduced within a tolerable range of the write error rate.

Also, in the computer system SYS according to the present application example, a speedup of computational processing can be attained through massively parallel processing (simultaneous processing) of computations.

With this arrangement, the properties of the computer system SYS according to the present application example can be improved.

(7b) Example 2

FIG. 37 will be referenced to describe a computer system according to the present application example.

FIG. 37 is a diagram illustrating one example of the configuration of a computer system including the arithmetic logic device according to the embodiments.

As illustrated in FIG. 37, in the computer system SYS, a plurality of arithmetic logic devices 1 according to the embodiments may share a single register 700X.

With this arrangement, in the computer system SYS according to the present application example, the number (area) of registers inside the system SYS can be reduced.

Consequently, the system area can be reduced in the computer system according to the present application example.

(7c) Example 3

FIG. 38 will be referenced to describe a computer system according to the present application example.

FIG. 38 is a diagram illustrating one example of the configuration of a computer system including the arithmetic logic device according to the embodiments.

As illustrated in FIG. 38, a plurality of groups GP including one or more arithmetic logic devices 1 according to the embodiments may be provided inside the computer system SYS. The register 700 is provided inside each group GP. The register 700 is shared by the plurality of arithmetic logic devices 1 inside each group GP.

The information INF stored in the register 700 may also be different for every group GP.

With this arrangement, in the present application example, the plurality of groups GP can execute processing based on different types of convolutional neural networks under different write conditions in parallel.

The computer system SYS according to the present application example can achieve both improved system performance and reduction in the area of the system.

(7d) Conclusion

The arithmetic logic device according to the embodiments can be applied to a computer system.

The computer system including the arithmetic logic device according to the embodiments can speed up computational processing (for example, product-sum operation processing).

The computer system including the arithmetic logic device according to the embodiments can execute computational processing according to conditions corresponding to the properties of a neural network. With this arrangement, the computer system including the arithmetic logic device according to the embodiments can reduce power consumption.

As above, with the computer system including the arithmetic device according to the embodiments, the properties of the computer system can be improved.

(8) Other

The arithmetic device according to the embodiments may take the following aspects.

(Aspect 1)

An arithmetic device according to an embodiment is provided with: a first computational circuit that includes first magnetoresistive effect elements provided on a first conducting layer; a second computational circuit that includes second magnetoresistive effect elements provided on a second conducting layer; a third computational circuit that executes computational processing using a first signal from the first computational circuit and a second signal from the second computational circuit; and a control circuit that controls the first to third computational circuits. The control circuit sets a condition on write operations with respect to at least one of the first and second magnetoresistive effect elements, based on information related to write error in at least one of the first and second magnetoresistive effect elements.

(Aspect 2)

An arithmetic device according to an embodiment is provided with: a first computational circuit that includes first magnetoresistive effect elements provided on a first conducting layer; a second computational circuit that includes second magnetoresistive effect elements provided on a second conducting layer; a third computational circuit that executes computational processing using a first signal from the first computational circuit and a second signal from the second computational circuit; a register that holds information related to write error in the first and second magnetoresistive effect elements and a condition on write operations with respect to the first and second magnetoresistive effect elements; and a control circuit that controls write operations with respect to the first and second magnetoresistive effect elements based on the information.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An arithmetic device comprising:
a first computational circuit including one or more first strings, each of the first strings having one or more first magnetoresistive effect elements provided on a first conducting layer;
a second computational circuit including one or more second strings, each of the second strings having one or more second magnetoresistive effect elements provided on a second conducting layer;
a third computational circuit configured to execute computational processing using a first signal from the first computational circuit and a second signal from the second computational circuit;
a data holding circuit configured to hold information related to write error in the first and second magnetoresistive effect elements and a condition on write operations with respect to the first and second magnetoresistive effect elements;
a control circuit configured to control write operations with respect to the first and second magnetoresistive effect elements based on the information; and
a table generation circuit configured to execute a test operation on at least one of the first and second magnetoresistive effect elements, and generates a table related to the write error and the condition.

2. The arithmetic device of claim 1, further comprising:
a first driver configured to supply a first write current that flows through the first conducting layer in a first direction; and
a second driver configured to supply a second write current that flows through the second conducting layer in a second direction different from the first direction,
wherein
the condition is a voltage value for generating at least one of the first and second write currents, and at least one of the first and second write currents is generated using a voltage value selected from among a plurality of voltage values based on the write error.

3. The arithmetic device of claim 1, further comprising:
a first driver configured to supply a first write current that flows through the first conducting layer in a first direction; and
a second driver configured to supply a second write current that flows through the second conducting layer in a second direction different from the first direction,
wherein
the condition is a pulse width of at least one of the first and second write currents, and the pulse width of at least one of the first and second write currents is set to a pulse width selected from among a plurality of pulse widths based on the write error.

4. The arithmetic device of claim 1, further comprising:
first word lines respectively connected to a corresponding one of the first strings; and
second word lines respectively connected to a corresponding one of the second strings,
wherein
the condition is at least one of a number of activated first word lines and a number of activated second word lines.

5. The arithmetic device of claim 1, wherein
each of the first magnetoresistive effect elements includes a first storage layer on top of the first conducting layer, a first reference layer above the first storage layer, and a first non-magnetic layer between the first storage layer and the first reference layer.

6. The arithmetic device of claim 1, wherein
the first computational circuit executes a logical sum operation on first data and second data,
the second computational circuit executes a logical product operation on the first data and the second data, and
the third computational circuit uses a result of the logical sum operation and a result of the logical product operation to execute a product operation on the first data and the second data.

7. The arithmetic device of claim 6, wherein
the third computational circuit obtains a result equivalent to a product operation of the first data and the second data by comparing the result of the logical sum operation on the first and second data with the result of the logical product operation on the first and second data.

8. The arithmetic device of claim 6, wherein
the control circuit, after writing the first data to the first and second magnetoresistive effect elements, supplies a first write current flowing in a first direction to the first conducting layer, executes the logical sum operation on the first and second data, supplies a second write current flowing in a second direction different from the first direction to the second conducting layer, and executes the logical product operation on the first and second data.

9. The arithmetic device of claim 1, wherein
the write error is expressed as a write error rate or a write error count.

* * * * *